(12) United States Patent
Kanno et al.

(10) Patent No.: US 6,614,696 B2
(45) Date of Patent: Sep. 2, 2003

(54) SEMICONDUCTOR DEVICE HAVING MEMORY CELLS COUPLED TO READ AND WRITE DATA LINES

(75) Inventors: Yusuke Kanno, Hachiouji (JP); Kiyoo Itoh, Higashikurume (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/325,920

(22) Filed: Dec. 23, 2002

(65) Prior Publication Data
US 2003/0090948 A1 May 15, 2003

Related U.S. Application Data

(63) Continuation of application No. 09/818,509, filed on Mar. 28, 2001, now Pat. No. 6,519,195.

(30) Foreign Application Priority Data

Mar. 31, 2000 (JP) ....................................... 2000-101204

(51) Int. Cl.[7] .............................................. G11C 11/34
(52) U.S. Cl. .................. 365/187; 365/203; 365/230.03
(58) Field of Search ................................ 365/203, 187, 365/210, 149, 209, 185.06, 230.03

(56) References Cited

U.S. PATENT DOCUMENTS

| 3,593,037 A | 7/1971 | Hoff, Jr. ...................... 365/182 |
| 3,706,079 A | 12/1972 | Vadasz et al. ................ 365/149 |
| 3,706,891 A | * 12/1972 | Donofrio et al. ............. 365/149 |
| 4,084,108 A | * 4/1978 | Fujimoto ...................... 365/150 |
| 4,803,664 A | 2/1989 | Itoh .............................. 365/210 |
| 4,879,682 A | 11/1989 | Engles .................... 365/185.25 |
| 4,893,278 A | 1/1990 | Ito .............................. 365/203 |
| 4,945,393 A | * 7/1990 | Beltram et al. .......... 365/185.06 |
| 5,396,452 A | * 3/1995 | Wahlstrom ..................... 365/149 |
| 5,656,528 A | * 8/1997 | Wahlstrom ..................... 438/152 |
| 6,016,268 A | 1/2000 | Worley ........................ 365/149 |
| 6,219,277 B1 | 4/2001 | Devin et al. ............ 365/185.21 |
| 6,519,195 B2 | * 2/2003 | Kanno et al. ................. 365/203 |

FOREIGN PATENT DOCUMENTS

JP    11-134866    5/1999

OTHER PUBLICATIONS

K. Ito, "Very Large Scale Integration Memory", Baifukan Co., Ltd., 1994, pp. 12–17.

* cited by examiner

Primary Examiner—David Nelms
Assistant Examiner—Gene N. Auduong
(74) Attorney, Agent, or Firm—Mattingly, Stanger & Malur, P.C.

(57) ABSTRACT

A semiconductor integrated circuit is disclosed, in which a memory is activated at high speed in commensurate with a high-speed logic circuit mounted with the memory in order to reduce the cost using a DRAM of a 3-transistor cell requiring no capacitor. A pair of data lines connected with a plurality of memory cells having the amplification function are set to different precharge voltage values, thereby eliminating the need of a dummy cell. The elimination of the need of the dummy cell unlike in the conventional DRAM circuit using a gain cell reduces both the required space and the production cost. A hierarchical structure of the data lines makes a high-speed operation possible. Also, a DRAM circuit can be fabricated through a fabrication process matched with an ordinary logic element.

5 Claims, 23 Drawing Sheets

SEMICONDUCTOR DEVICE HAVING MEMORY CELLS COUPLED TO READ AND WRITE DATA LINES

This is a continuation application of U.S. Ser. No. 09/818,509, filed Mar. 28, 2001 (now allowed), now U.S. Pat. No. 6,519,195.

BACKGROUND OF THE INVENTION

The present invention relates to a semiconductor integrated circuit device, or in particular to a technique for mounting a large-capacity memory and a logic circuit on the same chip.

The references cited in this specification are listed below and will be referred to with the reference numbers attached thereto: Reference 1, "Very Large Scale Integration Memory" by Kiyoo Itoh, published by Baifukan Co., Ltd., 1994, pp. 13, and Reference 2, JP-A-62-226494 (corresponding to U.S. Pat. No. 4,803,664).

In recent years, the importance of a system-on-chip LSI having mounted thereon both a dynamic random access memory (DRAM) and a logic circuit at the same time has increased for multimedia applications. In the future, it will become necessary to mount a DRAM, a static random access memory (SRAM) and a processor or the like on a single chip. With the conventional DRAM memory cell configured with a transistor and a special large-capacity capacitor, however, the process for fabricating the capacitor is so complicated that it is difficult to fabricate the DRAM through the same process as the logic circuit in a system-on-chic LSI the result is a limited cast reduction. Thus a DRAM memory cell free of a capacitor is required.

Candidates are the 4.5, 3.5, 3.5 and 2.5 line-type 3-transistor cells shown in FIGS. 1.0($a$) to (d) on page 13 of Reference 1, for example, which the present inventors have begun to re-evaluate. The 3-transistor cell comprises a storage MOSFET for storing an information voltage in the gate thereof, a write MOSFET for writing the information voltage in the aforementioned gate, and a read MOSFET for reading the state of the aforementioned gate voltage. The 3-transistor cell, which can be easily fabricated with substantially the same process as the logic circuit, may be fabricated at low cost. Also, this cell itself has an amplification function, and therefore the operation is stable as a large read signal voltage is read on a data line. Further, this cell is suitably operated at low voltage and therefore can be implemented with low power consumption constituting a suitable application to multimedia. These features have been discovered by the present inventors.

The DRAM comprising the 3-transistor cell is described also in Reference 2. This memory has a pair of data lines and is accessible for write and read operation at high speed in view of the fact that the information stored in the memory cell is detected and amplified by a sense amplifier, however, a dummy cell is required for each pair of the data lines, thereby requiring a correspondingly increased space. Also, the dummy cell disclosed in the cited Reference 2 has an amplification function, and therefore the reference voltage appearing on the data lines undesirably changes with time. As a result, it is difficult to set the start timing of the sense amplifier and in some cases, the read information cannot be detected by the sense amplifier. This is by reason of the fact that an excessively slow setting of the start timing of the sense amplifier reduces the differential voltage between the pair of the lines and makes unstable the operation.

SUMMARY OF THE INVENTION

Accordingly, an object of the present invention is to provide a memory not including a dummy cell.

A typical example of the present invention will be described. The dummy cell is eliminated by setting a different precharge voltage for each of the data lines making up the data line pair connected to memory cells having the amplification function. Also, the stable operation is secured by setting the reference voltage appearing on the data lines to a predetermined value. A specific example of the memory cell having the amplification function is so-called the 3-transistor cell including three transistors.

BRIEF DESCRIPTION OF THE DRAWINGS

FIGS. 18A, 18B show yet another embodiment of the invention, in which FIG. 18A shows an example using a sense amplifier as shown in FIG. 2B, and FIG. 18B shows an example using a sense amplifier as shown in FIG. 2A.

DETAILED DESCRIPTION OF THE EMBODIMENTS

Embodiment 1

Figure 1A:
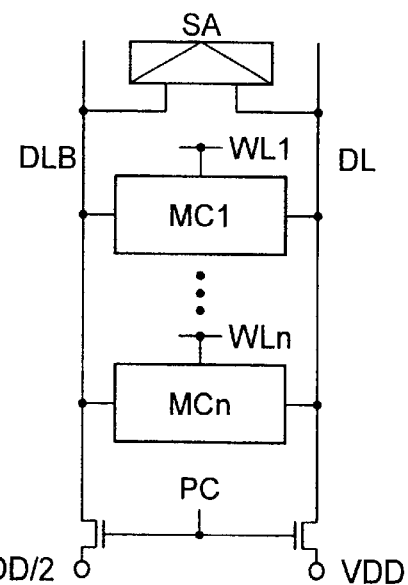
FIG. 1A shows a most basic configuration according to an embodiment of the invention.
Figure 2A:
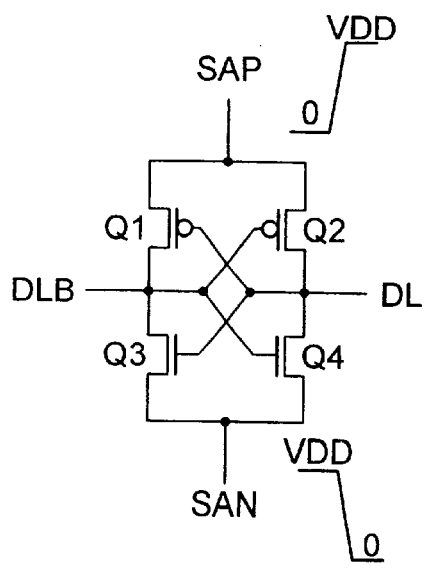
FIG. 2A is a diagram for explaining a configuration including a CMOS latch circuit, and FIG. 2B a diagram for explaining a sense amplifier of CMOS latch type having a power supply with a switch.
Figure 2B:
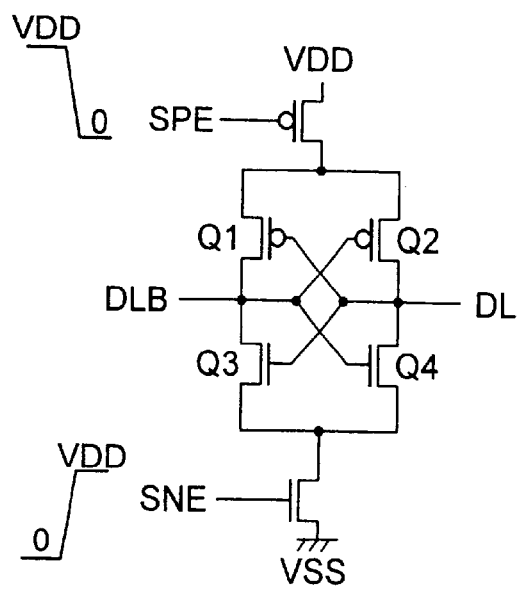

FIG. 1A shows the concept of the invention and a configuration of a pair of data lines in a DRAM with the operation timing. The pair of the data lines (DL, DLB) are connected to a plurality of memory cells (MC1 to MCn), a sense amplifier (SA) and a precharge circuit. The memory cells are gain cells as described later. The gain cell, when used with a N-type MOSFET described later, is defined as a cell in which a data line precharged to a high potential VDD can be discharged completely to zero selectively in accordance with the information stored in the memory cell. The gain cell can of course be used also with a P-type MOSFET, and in that case is defined as a memory cell in which the data line precharged to 0 V can be completely charged selectively to a VDD level. The data line pair includes a data line DL used for reading data from the memory cells and a data line DLB used for access at the time of differential amplification. The data line DLB is used also for writing and rewriting the data in the memory cell. The feature of the invention resides in that a different precharge voltage is set for each of the pair of the data lines. Specifically, when used with the N-type gain cell, for example, the precharge voltage of the data line DL is set to VDD while the precharge voltage of the data line DLB is set to a lower VDD/2. The sense amplifier is a CMOS sense amplifier of latch type as shown in FIGS. 2A, 2B, for example, and amplifies the differential voltage corresponding to the information appearing between the pair of the data lines to VDD at high speed. The sense amplifier is activated by applying 0 V and VDD to the terminals SAN, SAP, respectively, in FIG. 2A, and the terminals SPE, SNE, respectively, in FIG. 2B.

Figure 1B:
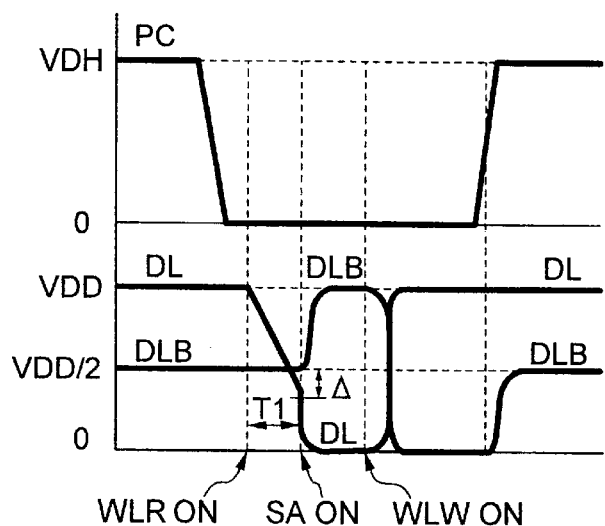
FIGS. 1B and 1C show operation waveforms thereof.
Figure 1C:
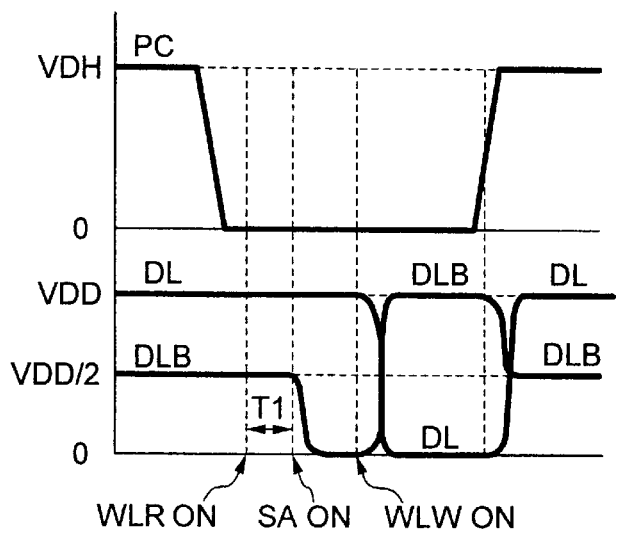

The basic operation of the invention will be explained with reference to FIGS. 1B, 1C on the assumption that a N-type gain cell is used. For reading the information stored in the memory cells, the first step is to precharge the data lines DL, DLB to VDD and VDD/2, respectively, by the precharge circuit, after which the precharge signal PC is set to low level, and then one of the word lines is selectively set to the read level ("WLR on" in the diagrams). As a result, it is determined whether the potential of the data line DL is held at the precharge level or discharged to 0 V in accordance with the information stored in the memory cells. FIG. 1B shows waveforms produced in the case where the memory cell holds such information as to discharge the data line DL. After the lapse of time T1 during which the voltage of the data line DL decreases from VDD/2 by Δ (sensitivity of the sense amplifier), the sense amplifier SA is activated to start amplification ("SA on" in FIGS. 1B, 1C). Thus, the data line DL is amplified to 0 V and the data line DLB to VDD at high speed. The sensitivity Δ is determined by the offset voltage of the sensor amplifier or the like and is about 100 mV. FIG. 1C shows waveforms produced in the case where a selected memory cell holds such information as to maintain the data line DL at the precharge level. In the case where the sense amplifier is activated after time T1, the data line DL is amplified to VDD and the data line DLB to 0 V at high speed. Specifically, the information stored in the memory cell can be accurately detected and read out by activating the sense amplifier the time T1 after activating the word line WL. The precharge voltage difference between the pair of the data lines, which is VDD/2 in the drawings, may alternatively be not less than Δ. Assuming that the precharge voltage difference between the pair of the data lines is Δ, the time T1 becomes shorter and an amplification at higher speed becomes possible. Further, in the case where the precharge voltage of the data line DLB is set to Δ instead of VDD/2 (i.e. VDD=2Δ), the read voltage difference for each of the pair of the data lines also has the same value for binary information. This condition leads to the minimum value of the precharge voltage of the data lines DL and DLB, and makes it possible to reduce the precharge voltage of the data line DL to 2Δ (about 200 mV). The advantage obtained by setting the precharge voltage of the data line DLB to VDD/2, however, is that the circuit design is facilitated and the precharge voltage level can be controlled with high accuracy. The precharge voltage of the pair of the data lines (DLB and DL), therefore, is determined based on the trade-off between the required speed and the difficulty of circuit design. The aforementioned condition for the precharge voltage ideally permits the minimum value of the operating voltage VDD to be reduced to 2Δ in principle. This is an example not necessarily requiring the sense amplifier. Once the requirement of the operating speed is satisfied, therefore, the operating voltage can be set to 2Δ without providing the sense amplifier.

The write operation into the memory cell can be performed by setting the word line selectively to the write level (a high voltage such as VDH) ("WLW on" in FIGS. 1B, 1C). In the case where the write data is different from the stored information voltage of the memory cell as shown in FIGS. 1B, 1C, for example, the data lines DL and DLB are impressed with differential voltages of opposite Polarities for the write operation. Also, in the rewrite operation, the data read out is amplified and the resulting amplified voltage is rewritten, as described later.

As described above, according to this invention, the precharge level of the data line DLB can be used as a reference voltage for amplification. Thus, the dummy cell is not required, and no space increase is required unlike in the prior art. Also, since the reference voltage Is constant with time, the sense operation can be stabilized.

FIGS. 3A, 3B and 4A, 4B show examples of the gain cell applicable to the present invention, which is a 3-transistor memory cell made up of N-type MOSFETs. Reference characters QS, QW and QR designate a storage transistor, a write transistor and a read transistor, respectively. This memory cell holds the information by writing data of VDD or 0 V corresponding to the binary information in the gate of the transistor QS and then turning off the transistor QW. The memory cell shown in FIG. 3 has a single word line connected to the write transistor and the read transistor. This memory cell, though small in area, requires a ternary level as a word line driving voltage. Specifically, as long as the memory cell is not selected (no row is selected), the voltage of the word line is fixed to VSS which is normally 0 V, while an intermediate voltage VDL is applied at the time of the read operation and a sufficiently high voltage VDH is applied at the time of the write or rewrite operation. The reason why the word line voltage is set to the intermediate level at the time of the read operation is in order to turn on the read transistor QR while keeping the write transistor QW off. Otherwise, the information charge held in the gate of the transistor QS would leak to the data line DLB by the read operation. For controlling the word lone voltage in ternary way as described above, the threshold voltages of the transistors QR and QW are required to be set properly. First, consider the case of discharging the data line DL at high speed by way of the transistor QR wish the stored information held at the time of the read operation, when the transistor QW is not easily turned on and the transistor QS is turned on. The threshold voltage (Vtw) of the transistor QW is desirably as high as possible and the threshold voltage (Vtr) of the transistor QR as low as possible. Usually, therefore, the threshold voltages of the two transistors connected to the same word line are conveniently set to different values. In the case where the voltage Vtw is excessively high, however, the condition VDH≧VDD+Vtw is required to be met to write the voltage VDD into the gate of the transistor QS, resulting in what is called a voltage stress breakdown of the MOSFETs. Thus, the maximum value that can be assumed by the voltage Vtw has its own limitation. In the case where the voltage Vtr is excessively low, on the other hand, a multiplicity of the row unselected memory cells connected to the data line DL come to be slightly turned on by what is called the subthreshold leak current, thereby hampering the normal read operation of the selected cell. Thus, the minimum value that can be assumed by the voltage Vtr has also its own limitation. Normally, to turn off the transistor QR with the word line voltage of 0 V as the row unselected voltage, the threshold voltage Vtr of the transistor QR is required to be not less than 0.5 V. This excessively high voltage Vtr reduces the read operation extremely at the read voltage of intermediate level. A method for solving this problem is to set the row unselected level (VSS) of the word line to a negative voltage instead of 0 V. Even in the case where the voltage Vtr is set to 0 V, for example, the transistor QR can be turned off during the row unselected period by biasing the voltage Vss deeply to −0.5 V or more. In such a case, the effective gate voltage for determining the drive rate of the transistor QR is given as VDL−Vtr, which is higher by 0.5 V as compared with the case where the voltage VSS is 0 V and the voltage Vtr is 0.5 V, thereby making a high-speed read operation possible. Further, for amplifying the data lines at higher speed, the parasitic capacitance of the data lines should be reduced. This is effectively achieved by hierarchical data lines described later. The threshold voltage of the transistor QS is determined on condition that the transistor QS is turned on strongly with the gate voltage of VDD and turned off or slightly turned on with the gate voltage of 0 V. Normally, Vtr≧0 V. An example of the operation of this memory cell will be described in detail later.

In the memory cell shown in FIG. 4, the gates of the read and write transistors are connected to the read word line and the write word line, respectively. The information stored in the memory cell is read by applying a read voltage (VDH) to the read word line, and the information is written or rewritten into the memory cell by applying a write voltage (VDH) to the write word line. The read voltage may be VDD as long as the read rate is sufficiently high. This memory cell has a larger area than the memory cell of FIG. 3, but the voltage of the word line is not required to be controlled in ternary fashion as described above. Thus, the problem of low-speed operation caused when setting the read voltage to the intermediate level is obviated, and the drive circuit can be easily designed. Also, the same threshold voltage can be employed for the transistors QR and QW in principle, and therefore the process cost for fabricating a plurality of MOSFETs is reduced. Further, the high-speed operation can be secured effectively even with a low operation voltage VDD by reducing the voltage Vtr and setting a unselected level to a negative voltage, as described above. Also, as described above, it is effective to reduce the parasitic capacitance of the data line.

Embodiment 2

Figure 5:
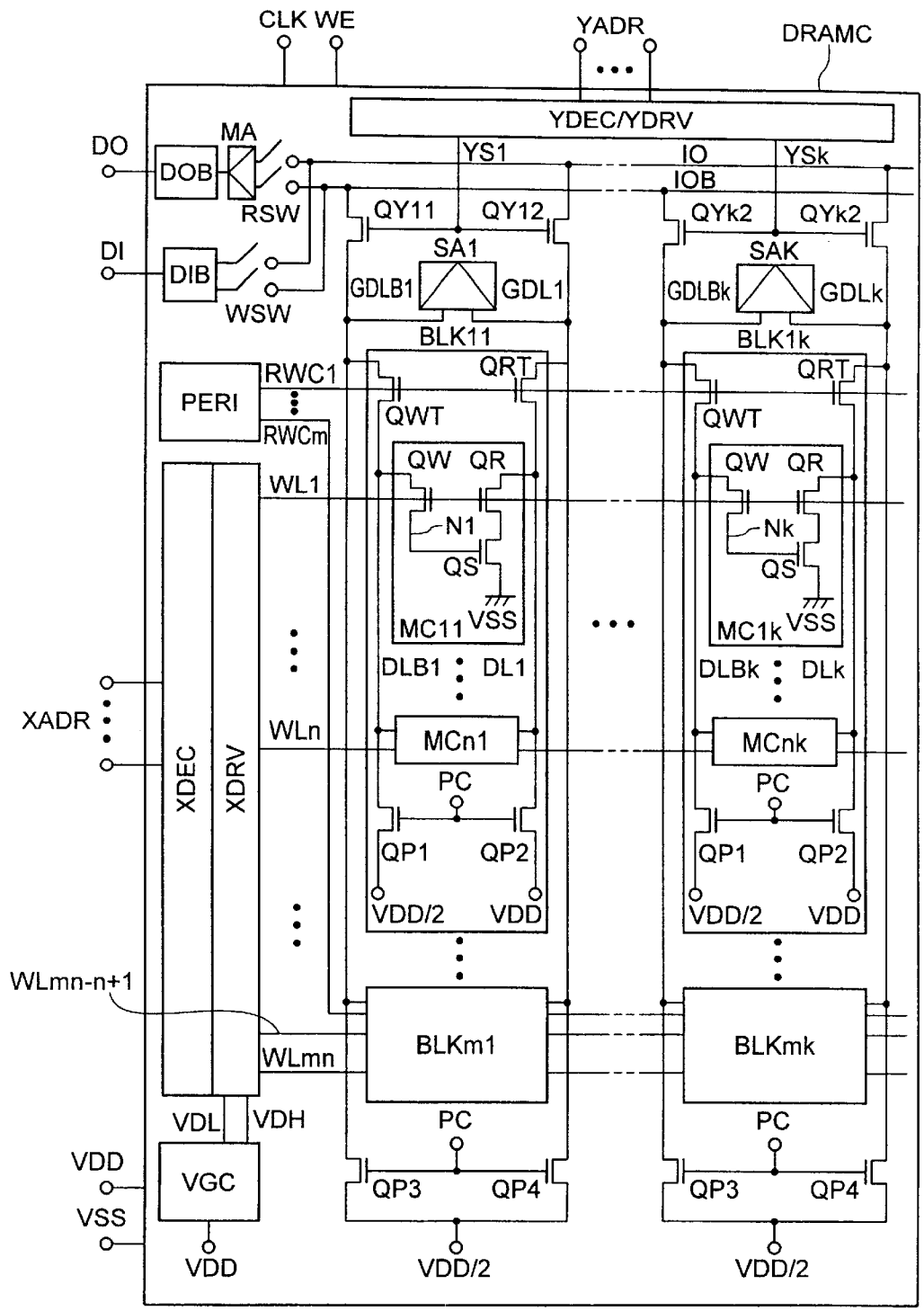
FIG. 5 is a circuit showing the essential parts of a memory circuit included in a semiconductor integrated circuit according to an embodiment of the invention.

FIG. 5 shows a memory circuit according to an embodiment as a specific application of the embodiment described above. The elements and the circuit blocks shown in FIG. 5 are formed and mounted on a single semiconductor substrate (LSI) such as single crystal silicon by the well-known production technique for the semiconductor integrated circuit.

According to this embodiment, the data lines have a hierarchical structure including pairs of the local data lines DL (DL1 to DLn), DLB (DLB1 to DLBk) for supplying and receiving data to and from the memory cells, and pairs of the global data lines GDL (GDL1 to GDLk), (GDLB1 to GDLBk) longitudinally extending in parallel. Each pair of the global data lines is connected to a plurality of blocks BLK (BLK11 to BLKmk). Each block includes a pair of local data lines connected with the memory cells MC (MC11 to MCn1) and switching MOSFETs (QRT, QWT) for connecting the global data line and the local data line. The switching MOSFETs are controlled by block select signals RWC (RWC1 to RWCm) generated by a peripheral circuit (PERI). A given pair of the global data lines described above are connected to a complementary common pair of the data lines (IO and IOB) by decoding an external input address (YADR) of the DRAM core (DRAMC) with a Y decoder (YDEC) and driving the corresponding switches QY1, QY2 with a corresponding Y driver (YDRV). Each pair of the global data lines, though not specifically limited, have a well-known differential amplifier of CMOS latch type SA including P-type MOSFETs Q1, Q2 and N-type MOSFETs Q3, Q4 as shown in FIG. 2A. The sense amplifier SA is activated by applying the ground potential VSS and the source voltage VDD to the common sources SAN and SAP, respectively. Also, the differential sense amplifier shown in FIG. 3B has the P-type MOSFET connected to the high-voltage power supply VDD and the N-type MOSFET connected to the ground side of the differential amplifier of latch type shown in FIG. 2A to control by switching the amplification operation with the control signals SPE, SNE. This sense amplifier, which undesirably increases the space by the size of the switch thereof, has the advantage that the driving force is large since the power supply is connected by the switch. This embodiment will be explained hereinafter with reference to the case the sense amplifier of FIG. 2A is used.

As described above, this invention has the feature that the high-speed amplification operation is made possible by the hierarchical structure of the data lines which can reduce the capacitance of the data line pair driven directly by the sense amplifier. This is by reason of the fact that the capacitance of the diffusion layer of the MOSFET is larger than the parasitic capacitance of the wiring layer metal and therefore the parasitic capacitance can be effectively reduced by reducing the number of the MOSFETs connected to the same wiring. The reason why the differential amplifier is used, on the other hand, is to prevent the rash current which otherwise might be generated in the transistors QR, QS at the time of writing into the memory cell. In the case where the voltage VDD is written into the node N1 of the block BLK11 among others, for example, the transistor QS is turned on. At the same time, the transistors QR and QW are also in on state, and therefore the data line DL1 acquires a path to the voltage VSS. As a result, the rash current is undesirably generated in the transistors QR and QS unless the data line DL1 is at 0 V. This poses the problem, for example, at the time of the operation of inverting the 0 information stored in the node N1 to the 1 information (what is called the inverted writing), for example. In the process, the data line DL1 is at the precharged level, so that the rash current undesirably flows in the transistors QR and QS unless written differentially.

The local data lines DL and DLB have precharge MOSFETs QP1 and QP2 controlled by the precharge signal PC. During the precharge period, the data lines DL and DLB are precharged to a source voltage VDD (say, 1 V) and a voltage VDD/2 (say, 0.5 V) one half as large. Also, the pair of the global data lines GDL, GDLB are precharged to the VDD/2 level during the precharge period by the precharge MOSFETs QP3, QP4 controlled by the precharge signal PC.

The memory array is configured with a plurality of data line pairs and a plurality of word lines (WL1 to WLmn, etc.) orthogonal thereto. In the drawing, four word lines WL1, WLn, WLmn−n+1, WLmn are illustrated as representative ones. By decoding an external input X address (XADR) with an X decoder (XDEC), one of the word lines is selectively driven by the X driver (XDRV) (also called the word driver). This drawing shows an example in which the X address and the Y address are input without multiplexing, but the number of address terminals can be reduced to one half by multiplexing the addresses.

Each memory cell is arranged at the intersection between a word line and local data lines DL, DLB, and is configured with three transistors including a storage MOSFET QS adapted to turn on or off by the information voltage at the gate thereof when the particular word line is selected, a read MOSFET QR for reading the information held by the transistor QS and transmitting it to the local data line DL, and a write MOSFET QW for applying the write data from the local data line DLB to the gate of the transistor QS. According to this embodiment, the gates of the transistors QS and QR are connected to the same word line. The source-drain path of the storage MOSFET QS is connected to the read MOSFET QR and the ground potential VSS (0 V) described above.

The data are input and output to and from outside of the DRAM core. The read switch SW is turned on and the memory cell is read. Then, the stored information transmitted to the lines IO and IOB is output to the data output terminal DO through a main amplifier and a data output buffer DOB. At the time of write operation, on the other hand, the data input to the data input buffer DIB from the data input terminal DI is transmitted with a differential voltage to the lines IO and IOB by turning on the write switch WSW and written in the memory cell by the write operation described later.

A power generating circuit (VGC) has the function of decreasing, with a regulator or the like, the voltage VDD input from an external source to form a VDL power supply and the function of generating a VDH power supply by boosting the voltage VDL or VDD with a charge pump circuit or the like. The voltages VDL and VDH are used as a read level and a write level, respectively, of the word line described later. In the case where the VDL power supply is required to be higher than the voltage VDD, the VDD voltage input from an external source is directly boosted or regulated and then boosted.

This embodiment has the feature that a reference voltage level of the differential sense amplifier is generated without a dummy cell by combining a memory cell having the amplification function and a pair of the local data lines set to different precharge voltages.

Figure 6:
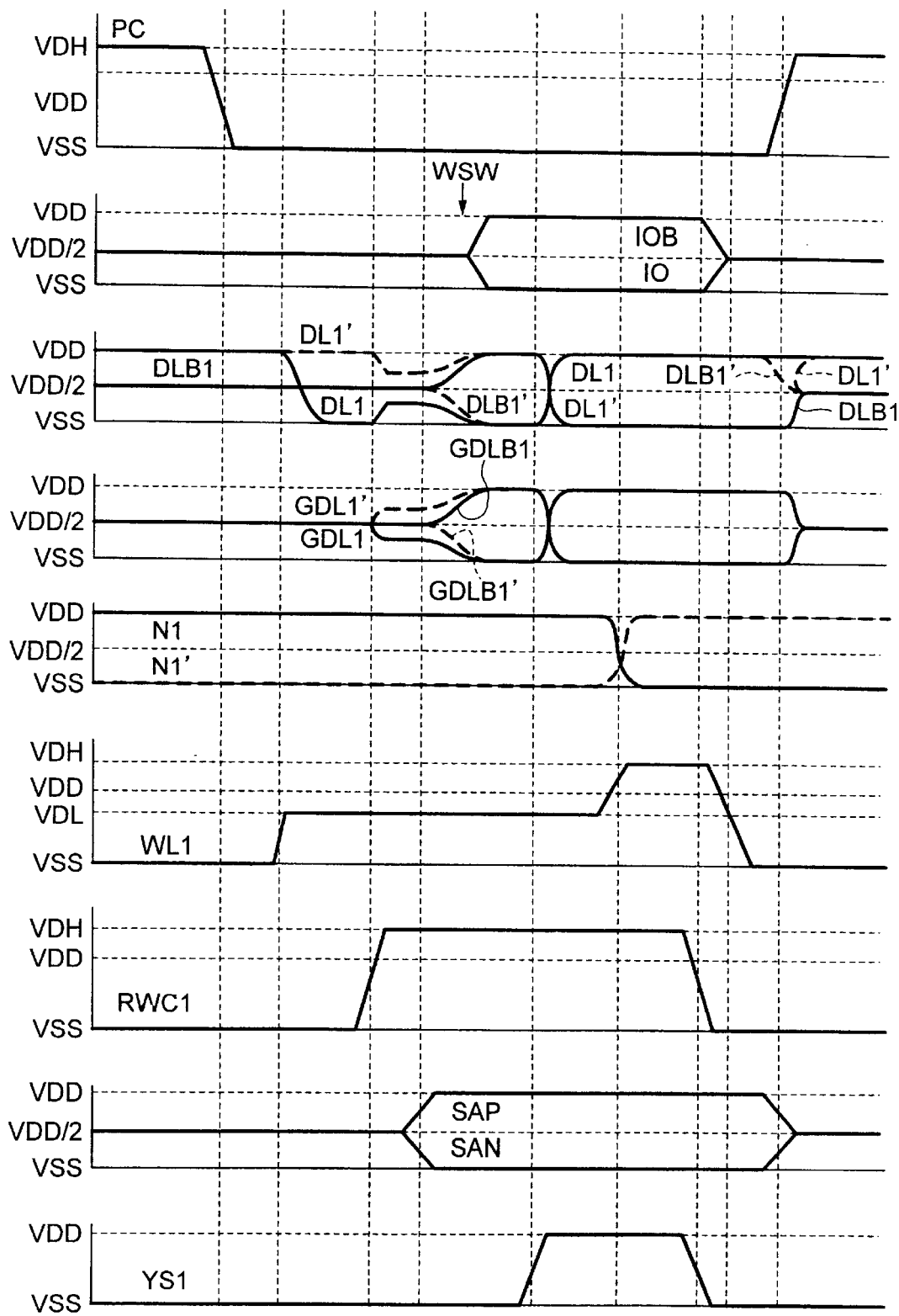
FIG. 6 shows waveforms for explaining an example of the write operation of the memory circuit of FIG. 5.

FIG. 6 shows waveforms for the write operation of the memory cell according to this embodiment. The block BLK11 will be taken as an example then the precharge signal PC reaches a high voltage VDH (VDH≧VDD+Vtw (where Vtw is the threshold voltage of the transistor QW)), the local data lines DL and DLB are precharged to the source voltages VDD and VDD/2, respectively. In similar fashion, the pair of the global data lines (GDL, GDLB), the common sources (SAN, SAP) of the sense amplifier SA and the common IO lines (IO, IOB) are precharged to VDD/2.

Once the precharge signal PC reaches 0 V, the precharge MOSFET is turned off, and therefore the pair of the lines described above assume a floating state thus continue to hold the precharge voltage. Under this condition, the write and read operations into and from the memory cell are carried out. An explanation will be given below of the write, read and refresh operations of the memory cell in the case where the word line WL1 and the column line YS1 are selected.

(1) Write Operation

Figure 3A:
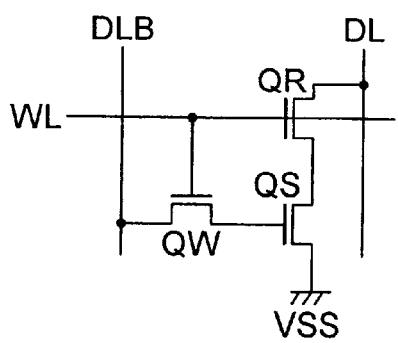
FIG. 3A is a circuit diagram of a 3-transistor DRAM having the same word line for read and write operations.
Figure 3B:
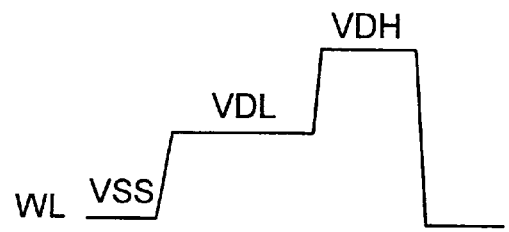
FIG. 3B shows a waveform for driving the word line.
Figure 4A:
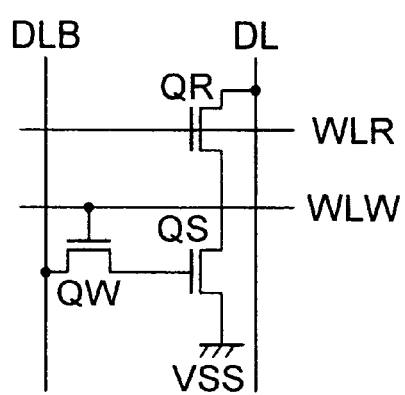
FIG. 4A is a circuit diagram of a 3-transistor DRAM with a read word line and a write word line separated from each other.
Figure 4B:
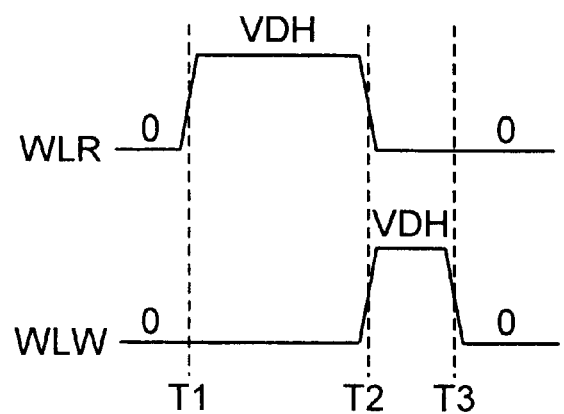
FIG. 4B shows waveforms for driving the word lines.

For writing the high voltage VDD or the low voltage VSS corresponding to binary information 1 or 0, respectively, into the storage node (N1) of the memory cell MC1, a sufficiently boosted high voltage VDH is required to be applied to the word line WL1. This voltage VDH is required to satisfy the relation VDH≧VDD +Vtw, where Vtw is the threshold value (say, 0.5 V) of the write MOSFES QW (VDH=2.5 V, for example). Under this condition, assume that one (RWC1) of the block select signal lines (RWC) is selected. Then, the differential voltage corresponding to the write data input from the data Input terminal D1 is applied to the gate of the transistor QS through the corresponding local data line from the global data line and written into the memory cell MC11. It should be noted here, however, that once the voltage VDH is applied to the word line WL1, the information stored in the column unselected memory cells not selected by a column select signal which is arranged on the same word line is destroyed. Specifically, the precharge voltage VDD/2 of the corresponding local data line DLB1 is undesirably applied to the storage node in each column unselected memory cell. In order to prevent this information destruction, all the memory cells on the selected word line are read beforehand and by amplifying them with each sense amplifier, the amplified voltage is rewritten in the respective memory cells. In the selected memory cell MC11, however, the amplified voltage is written in by replacing it with the input data voltage from the common data line IOB. Thus, the read operation is required in advance of the write operation. This read operation will be explained below. As described above, the word line voltage of the memory cell in FIGS. 3A, 3B is required to be at the ternary levels, including voltage VDL for reading, the voltage VDH for writing and the voltage VSS for no row selection.

First, an explanation will be given of the operation of reading the high voltage VDD which may be stored in the memory cell MC11. The read operation is started by applying a pulse of intermediate level voltage VDL to the word line. The amplitude VDL of this pulse is required to be se in such a manner as to turn on the transistor QR and to turn off the transistor QW. For this purpose, the following conditions are required to be met.

Assume that the memory cell stores the binary information of voltage VDD or 0 V in the gate of the transistors QS and the stored information is detected according to whether the transistor QS is on or off when a read pulse is applied to the word line. For applying the read pulse VDL and turning on the transistor QR, the following relation is required to be satisfied.

$$VDL > Vtr \quad (1)$$

where Vtr is the threshold value of the transistor QR. If the information stored in the gate of the transistor QS is not to be destroyed upon application of a read pulse to the transistor QW, the following conditions must be met. Specifically, the conditions for turning off the transistor QW are determined which assure that the charge accumulated in the gate of the transistor QS is not released to the local data line DLB1 through the transistor QW in the case where the gate voltage of the transistor QS is VDD. The data line precharged to VDD/2 is the source of the transistor QW, and therefore the condition is described as follows.

$$VDL < VDD/2 + Vtw \quad (2)$$

where Vtw is the threshold value of the transistor QW. In the case where the gate voltage of the transistor QS is 0 V, on the other hand, the transistor QS remains off even if the gate of the transistor QS is charged and the gate voltage is boosted from 0 V by the turning on of the transistor QW, if the boosted voltage is lower than the threshold voltage Vts. The condition for this is as follows.

$$VDL < Vts + Vtw \quad (3)$$

If the charge accumulated in the gate of the transistor QS is not to be released to the local data lines for a long time (say, 2 ms to 64 ms), the threshold voltage Vtw is desirably increased. For high-speed reading, on the other hand, the voltages Vts and Vtr are desirably as low as possible. Thus, the threshold values of these three voltages can be freely selected within a range satisfying the aforementioned inequality. Nevertheless, the voltage Vtr cannot be reduced as much as the voltage Vts. Otherwise, an instability may be caused. The reason is that a leak current (what is called the subthreshold current) flows in the transistor QR in a multiplicity of other unselected memory cells connected to the same local data line thereby reducing the precharge voltage of the local data line. Assuming that VDD=1 V, Vtw=1 V, Vts=0 V and Vtr=0.5 V, for example, the range of the voltage VDL in which the stored information is not destroyed by the transistor QW is given as follows from equations (1) to (3).

$$1.5 \, V > VDL > 0.5 \, V$$

By setting the voltage VDL in this way, the data lines DL1 and DLB1 thus far precharged to VDD and VDD/2, respectively, are changed as follows. In the case where the gate (storage node N1) voltage of the transistor QS is VDD, the data line DL1 is discharged to 0 V (designated by N1 in FIG. 6). Since the transistor QWT is in off state, the data line DLB1 is maintained at the precharge level VDD/2. In the case where the gate (storage node N1) potential of the transistor QS is 0 V, on the other hand, the transistor QS is off and therefore the data line DL1 holds the precharge level (designated by N1' in FIG. 6). Since the transistor QWT is in off state, the data line DLB1 is maintained at the precharge level VDD/2. As already explained with reference to the first embodiment, the high-speed read operation can be effectively accomplished by setting the row unselected level of the word line at a negative voltage and the voltage Vtr at a value as low as 0 V.

Now, after the stored information is read out on the local data line DL1, assume that the control signal RWC1 is set to high level thereby to turn on the transistors QRT and QWT. The data lines DL1 and GDL1 or the data lines DLB1 and GDLB1 are connected to each other. In the process, the data lines DLB1 and GDLB1 are at the same potential level (precharge level), and therefore the potential remains unchanged. Nevertheless, a read signal (vs) appears on the data line GDL1 due to the charge share corresponding to the parasitic capacitance as described below.

In the case where the local data line DL1 is discharged to 0 V, the level of the global data line GDL1 is reduced by vs from VDD/2, and the data line DL1 also comes to assume the same level, i.e. VDD/2 less vs. In the case where the read data line DL1 remains at the precharge level VDD, on the other hand, the data line GDL1 increases by a small voltage (+vs) from the precharge voltage VDD/2, and the data line DL1 also comes to assume the same level of VDD/2 +vs. This situation is described by dotted line in the waveform diagrams of the data lines DL1, DLB1, GDL1, GDLB1 of FIG. 6, and designated by dashed symbols DL1', DLB1', GDL1', GDLB1', respectively. In this way, the small read signal of −vs or +vs for VDD/2 appears on the global data line GDL1 in accordance with the binary information (1 or 0) held in the storage node of the memory cell. These voltages can be detected and amplified by the sense amplifier based on the precharge voltage VDD/2 of the other global data line GDLB1. In the case under consideration, an explanation will be given of the case using a sense amplifier as shown in FIG. 2A. This amplification operation is carried out by increasing the common source line SAP to a high voltage such as VDD and reducing the common source line SAN to a low voltage such as VSS. As a result, the global data line GDL is reduced to low level (VSS), while the other global data line GDLB1 complementary with the data line GDL1 assumes a high level (VDH). As described above, this invention has the feature that the dummy cell which has conventionally been an essential part can be eliminated for amplification of the information stored in memory. By the way, the control signal RWC1 can be raised to high level as soon as the precharge signal PC is reduced to low level. In such a case, the cases of timing to be controlled are reduced and therefore the design is facilitated.

The differential voltage between VDD and VSS applied to the pair of the common data lines (IC, IOB) for writing in the memory cell after amplification in the sense amplifier is sent to the pair of the global data lines (GDL1, GDLB1) and the pair of the local data lines (DL1, DLB1) by setting the column select line YS1 to high level selectively. (In the drawing, the behavior of the data line DL1' indicated by dotted line represents the case in which 0 V is stored in the gate of the storage MOSFET QS.) After that, the word line level is raised to the write level VDH. As a result, the voltage of the write data line DLB1 is transmitted to the gate of the transistor QS in the memory cell MC11 thereby to complete the write operation. An amplified stored information voltage is rewritten in other column unselected memory cells on the same word line.

Upon completion of the write operation into the column selected memory cell and the rewrite operation Into the column unselected memory cells as described above, the word lines WL1 and YS1 are reduced to low level and the transistors QY1, QY2 are turned off. Further, the precharge signal PC is set to high level (VDH) so that each local data line pair and each global data line pair are precharged in preparation for the next memory access.

(2) Read Operation

Figure 7:
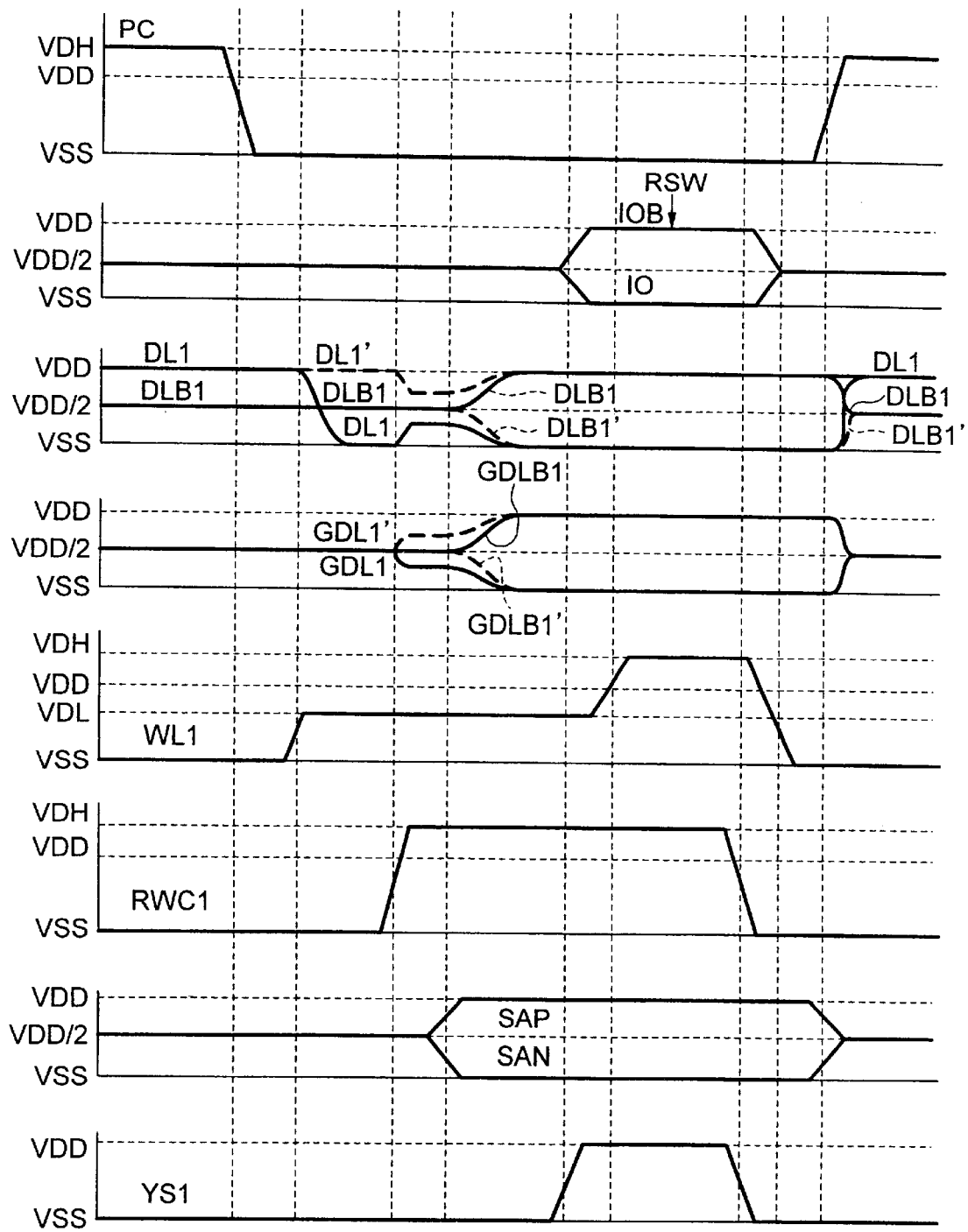
FIG. 7 shows waveforms for explaining an example of the read operation of the memory circuit of FIG. 5.

FIG. 7 shows waveforms for the read operation. In the read operation, like in the write operation described above, the read signal of a row and column selected memory cell is amplified by the sense amplifier SA and output to a common data line pair, and led out by way of the data output terminal DO. By setting the row select level of the word line to a high voltage VDH, a voltage corresponding to the read information is rewritten for all of the column-selected cells and the column unselected cells.

(3) Refresh Operation

The refresh operation is performed in such a manner that the column select line YS is left in unselected state in FIG. 7 while the read/rewrite operation for all the memory cells on the word lines is performed for all the word lines.

Figure 8:
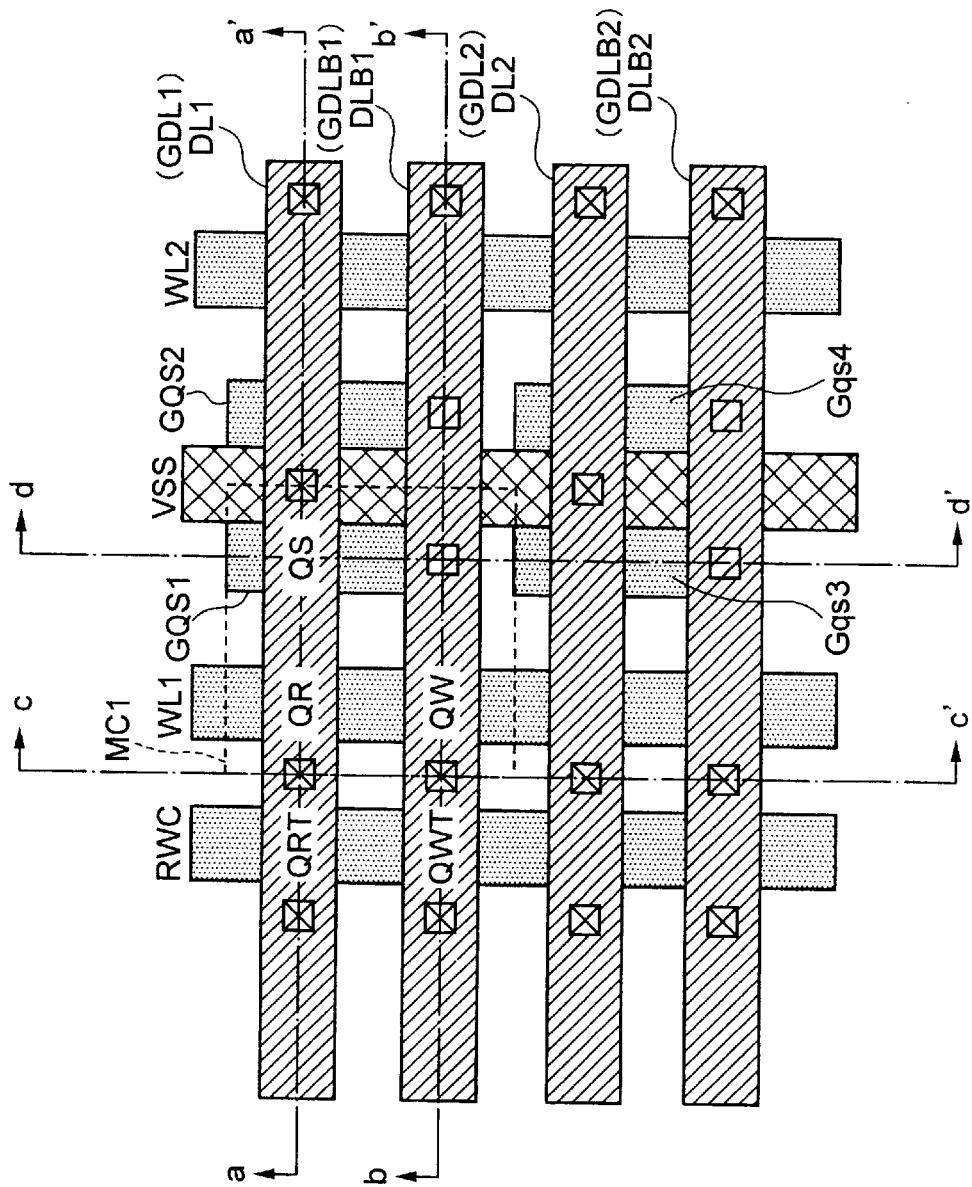
FIG. 8 is a diagram showing a layout of the connections around the memory cell of FIG. 5 according to an embodiment of the invention.

FIG. 8 is a diagram showing a layout related to the memory cells according to this invention. FIG. 8 shows four memory cells shown in FIG. 5 and the transistors QRT, QWT. A part of the word line WL1 fabricated of polysilicon layer (POLY) or the like forms the gate of the transistors QR, QW of the memory cell MC11, and the polysilicon layer in the same layer forms the gate (GQS) of the transistor QS. The local data line pair (DL1, DLB1, etc.) is formed of the metal of the same layer (M2), and the global data line pair (GDL1, GDL1B) are formed of the metal of another layer (M3). The contacts LCT shown in FIGS. 9A, 9B connect the diffusion layer and the gate to each other directly. The source of the transistor QS is impressed with the voltage VSS. This contact LCT is formed of one metal layer (M1) and shared by the adjacent memory cell for reducing the size. As a result, the two memory cells are arranged in the same mirror symmetric relationship. The two line pairs are connected by the MOSFET (QRT, QWT) having the gate constituting a part of the polysilicon wiring or the like.

Figure 9A:
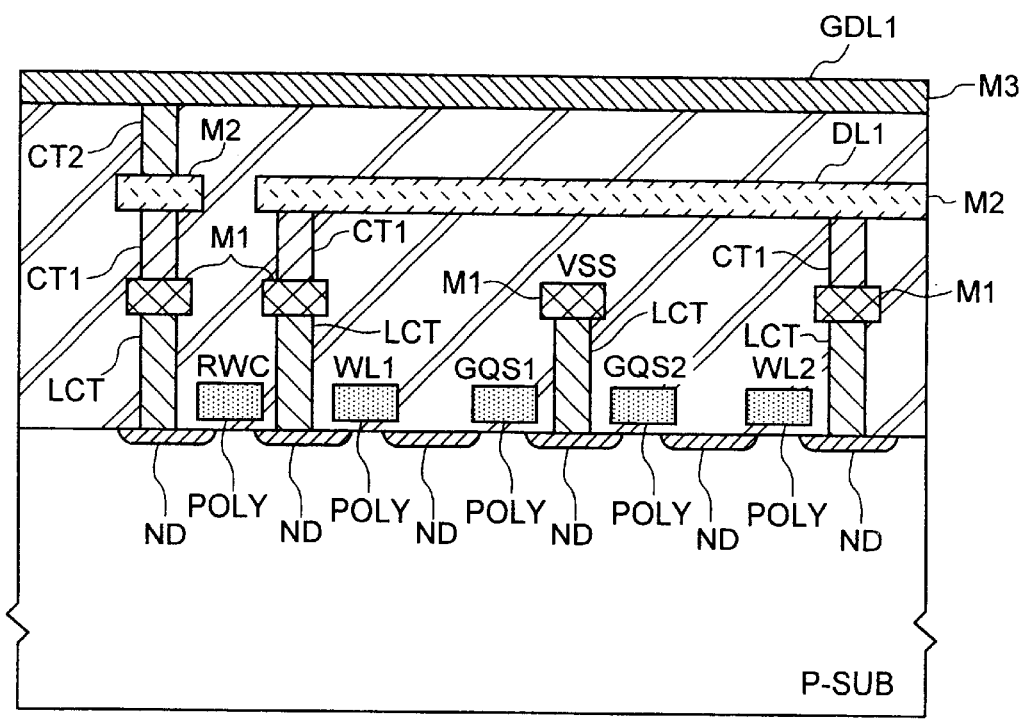
FIG. 9A is a sectional view taken in line a–a' in FIG. 8.
Figure 9B:
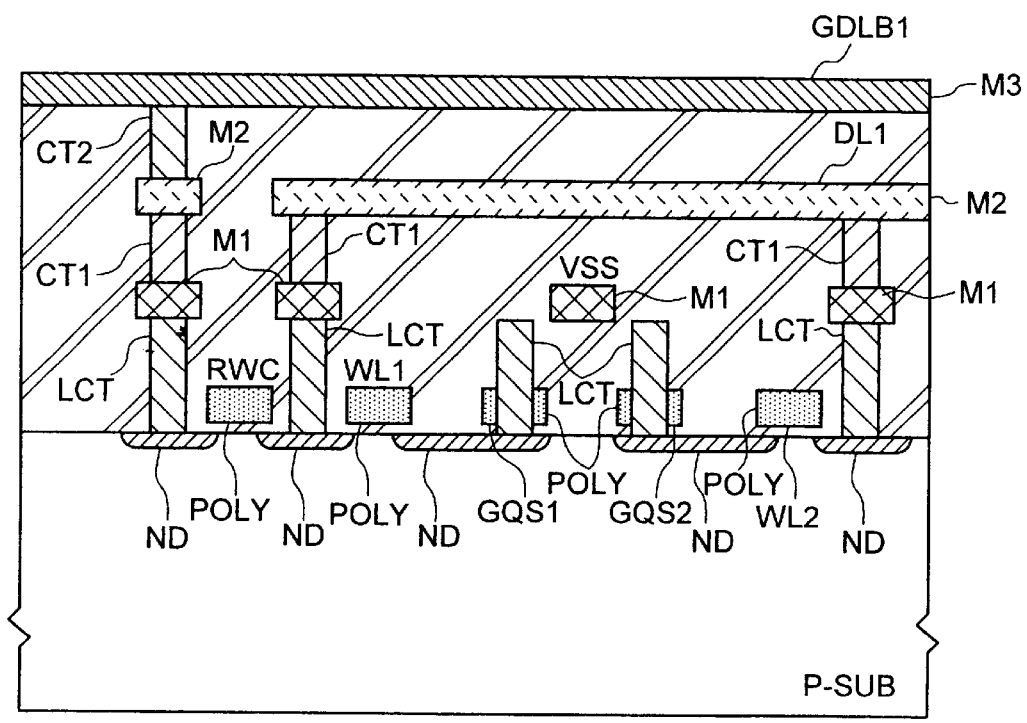
FIG. 9B is a sectional view taken in line b–b' in FIG. 8.
Figure 10A:
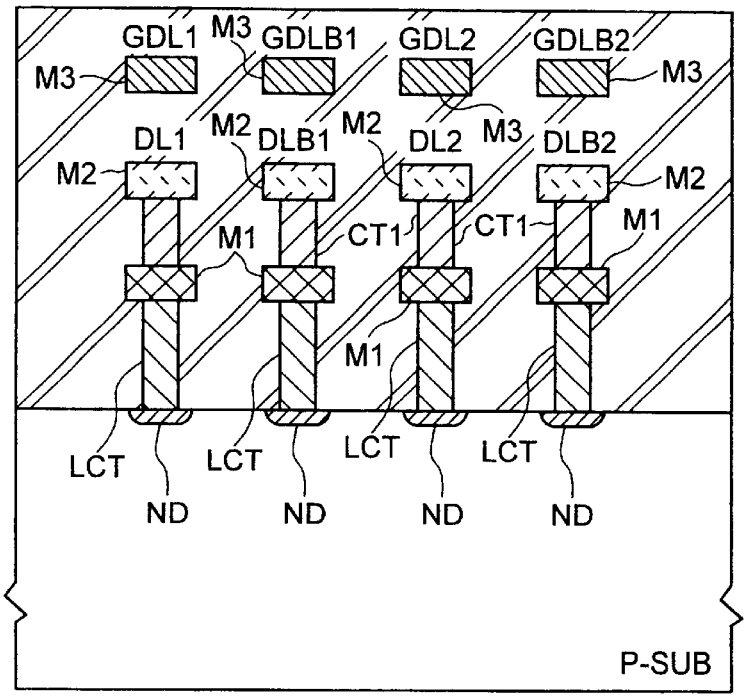
FIG. 10A is a sectional view taken in line c–c' in FIG. 8.
Figure 10B:
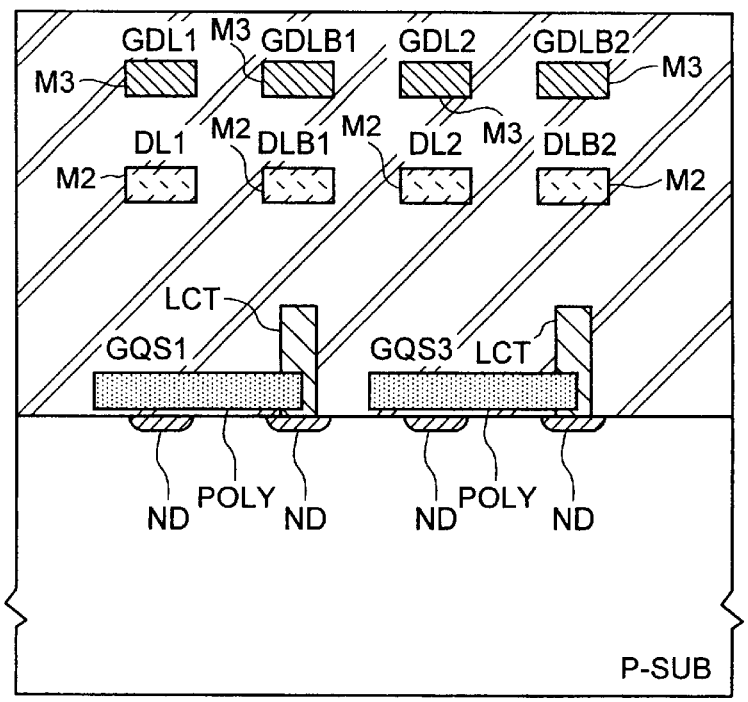
FIG. 10B is a sectional view taken in line d–d' in FIG. 8.

To clarify the relation between the layers, the sectional views taken in lines a–a' and line b–b' of FIG. 8 are shown in FIGS. 9A and 9B. FIG. 9A shows the sectional view taken in line a–a' representing the section passing through the local data line OL1 and the global data line GCL1 FIG. 9B is the sectional view taken in line b–b' representing the section passing through the local data line DLB1 and the global data line GDLB1. In these diagrams, two contacts LCT are shown. Further, the sectional views taken in line c–c' and line d–d' orthogonal to the sectional views taken in lines a–a' and b–b', respectively, are shown in FIGS. 10A and 10D. FIG. 10B shows two contacts LCT.

Embodiment 3

In the second embodiment described above, a sufficient timing margin is available in view of the fact that the read and transfer MOSFET QRT and the write and transfer MOSFET QWT are controlled by a single signal RWC. Also, the electrical balancing level of the pair of the data lines as viewed from the sense amplifier is so good that a correspondingly stabler, high-speed operation is possible. In view of the need of wiring the power lines of the voltages VSS and VDD/2 for each block BLK, however, the area may increase in some cases.

Figure 11:
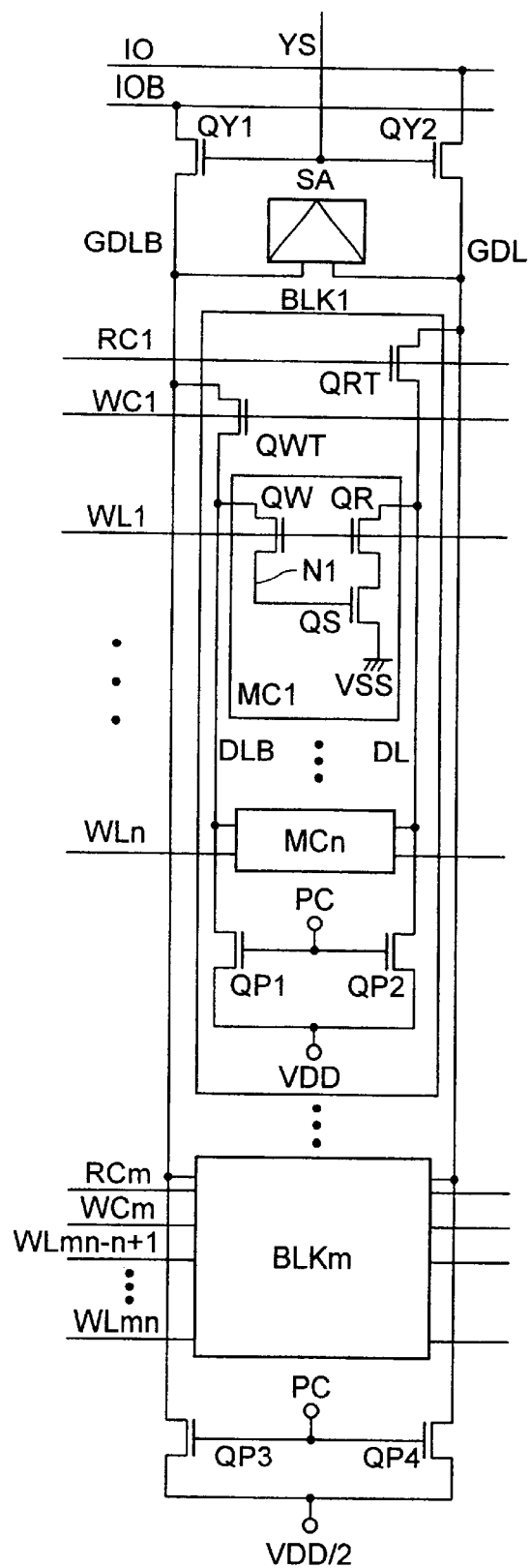
FIG. 11 is a circuit showing the essential parts of a memory circuit included in a semiconductor integrated circuit according to another embodiment of the invention.

FIG. 11 shows the case in which only the voltage VDD is used for the precharge power supply of the local data lines DL, DLB, the MOSFET QRT for selecting the read block is controlled using the read signal RC, and the write control signal WC is used for controlling the MOSFET QWT for selecting the write block, thereby using independent control signals for the read and write operations. According to this embodiment, as compared with the second embodiment, the operating speed may be decreased due to the independent control operations of the read signal RC and the write signal WC. Nevertheless, the number of precharge power lines for each block arranged in the memory array can be reduced to one half, and thus the space can be reduced.

Figure 12:
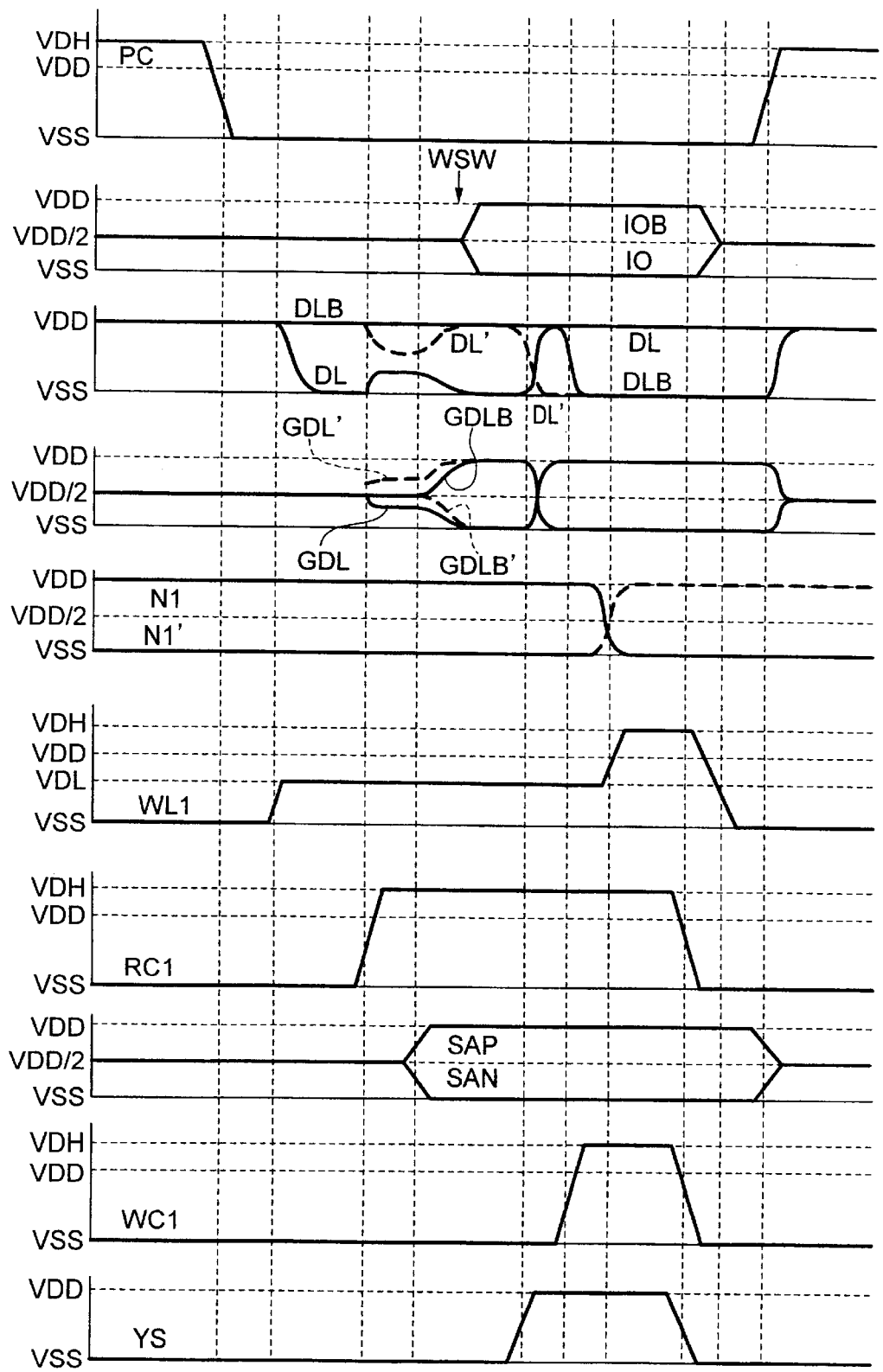
FIG. 12 shows waveforms for explaining an example the write operation of the memory circuit shown in FIG. 10.

FIG. 12 shows operation waveforms for the embodiment shown in FIG. 11. An explanation will be given taking as a typical example the case in which the memory cell MC1 of the block BLK1 in FIG. 11 has been selected. The write operation is performed in substantially the same manner as in FIG. 6 except that the connection method is different for the pair of the global data lines and the pair of the local data lines. In FIG. 6, the write and transfer MOSFET QWT and the read and transfer MOSFET QRT are controlled by being turned on/off at the same time using the same control signal RWC. According to this embodiment, in contrast, the data lines DL and GDL are connected using the control signal RC1 only for the MOSFET QRT after the potential of the local data line DL reaches VSS (in the case where the potential of the storage node N1 is VDD) or reaches the precharge level VDD (in the case where the potential of the storage node N1 is 0 V). As a result, the data lines DL and GDL, as explained with reference to FIG. 6, reach the level of VDD/2–vs in the case where the storage node N1 is at VDD and reach the level of VDD/2 +vs in the case where the storage node N1 is at 0 V. After the potential of the global data line GDL has been established in this way, the potential of the pair of the global data lines is amplified by activating the sense amplifier. After amplification by the sense amplifier, as explained with reference to FIG. 6, transmission of write data from an external source turns on the transistor QWT by raising the control signal WC1 to VDH level, so that the write data is transmitted to the local data line DLB. After the write data is transmitted to the local data line DLB, the potential of the word line is set to the write potential level VDH, so that the write data is written in the storage node N1 of the memory cell. At the time of reading, the transistors QRT and QWT cannot be turned on at the same time. This is by reason of the fact that the precharge level of the local data line DLB is VDD, and therefore if the transistor QWT is turned on at the time of reading, a small positive signal would be undesirably transmitted to the global data line GDLB precharged to VDD/2, thereby making it impossible to obtain an accurate reference potential. Especially in the case where the storage node N1 is at VDD, the accurate amplification operation may become impossible depending on the magnitude relation with the small positive signal +vs appearing on the global data line GDL.

In the read operation, the read signal for the selected memory cell is amplified by the sense amplifier SA and output to the pair of the common data lines and led out from the data output terminal DO. By increasing the select level of the word line to the high voltage VDH, a voltage corresponding to the read information can be rewritten for all the column selected cells and the column unselected cells.

For the refresh operation, on the other hand, the column select line YS is kept in unselected state while the read/rewrite operation for all the memory cells on the word lines is performed for all the word lines.

Embodiment 4

In the embodiments described above, the pair of the local data lines connected to the pair of the global data lines constitutes only a selected block in the case of amplification by the sense amplifier. This configuration can reduce the number of the MOSFETs connected to the pair of the global data lines and makes possible a high-speed amplification operation with a small load capacitance. This is because the parasitic capacitance of the metal wiring is generally smaller than the parasitic capacitance generated by the connection of a multiplicity of MOSFETs. Nevertheless, it is sometimes more desired to save the number of the wirings than to achieve the high-speed amplification operation. A memory array having a reduced number of wirings according to an embodiment will be explained below.

Figure 13:
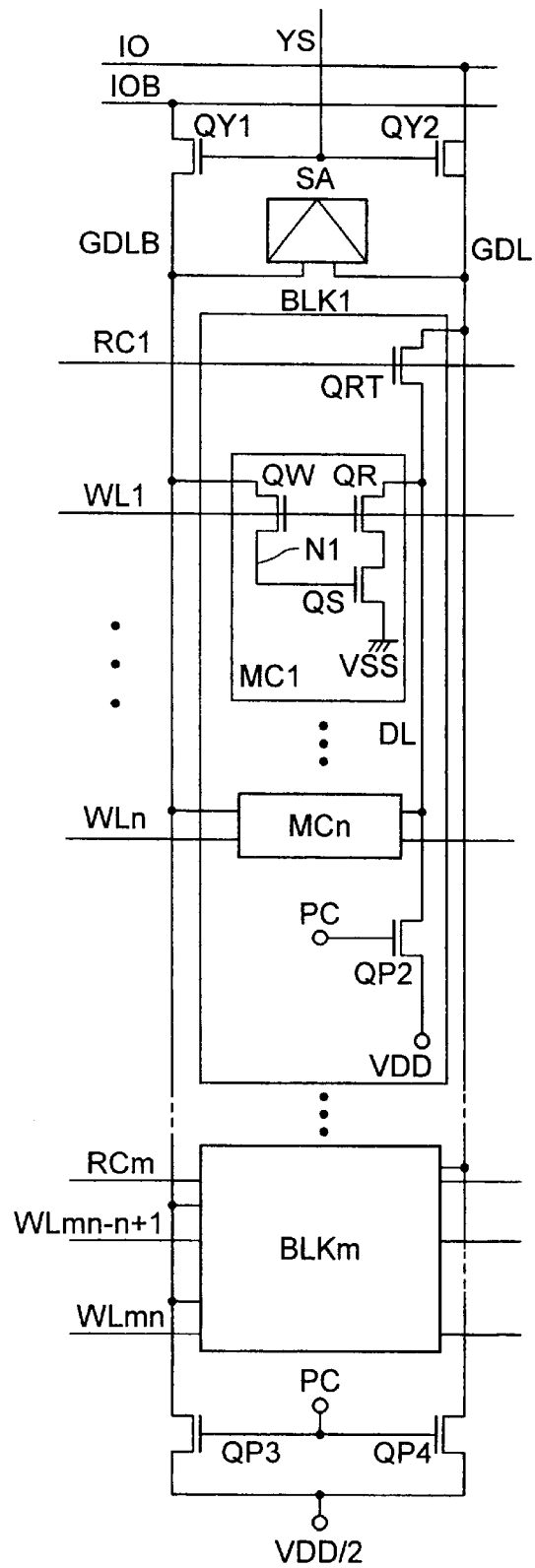
FIG. 13 is a circuit showing the essential parts of a memory circuit included in a semiconductor integrated circuit according to still another embodiment of the invention.

FIG. 13 shows a memory circuit according to another embodiment of the invention. The feature of this embodiment lies in that the number of wirings is reduced by the write local data line (DLB) and the global data line GDLB doubling as each other and thus eliminating the transistor QWT required in the second embodiment. Thus, the transistor QW of FIG. 5 is directly connected to the global data line GDLB. As a result, as described later, signal lines o other than the data lines can be arranged on the memory array without adding a wiring layer, and the e limited wiring layer can be effectively utilized.

Figure 14:
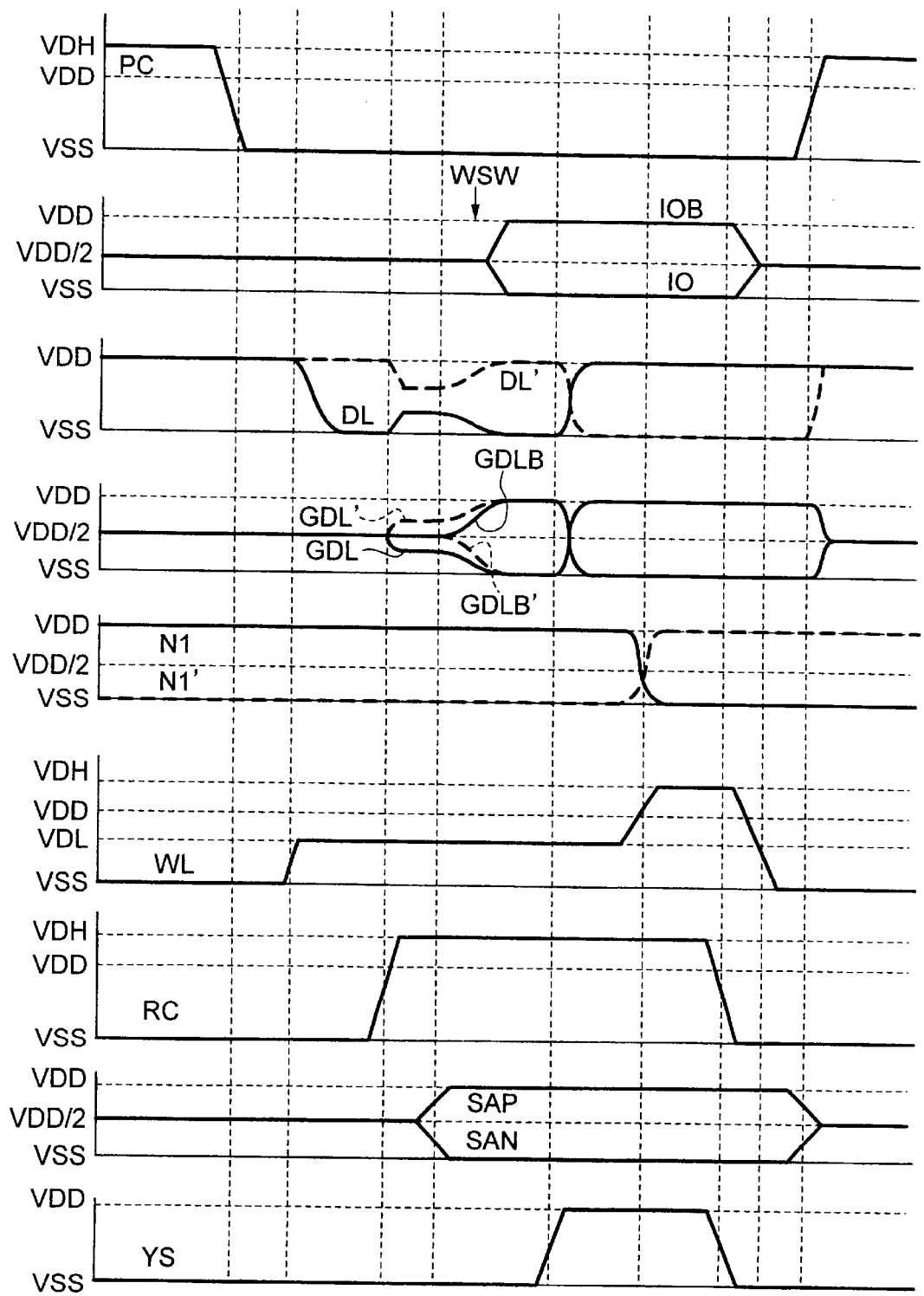
FIG. 14 shows waveforms for explaining an example the write operation of the memory circuit shown in FIG. 13.

FIG. 14 shows waveforms for the write operation of the memory circuit shown in FIG. 13. As explained with reference to FIG. 6, the read and write operation for the memory is carried out after the precharge signal PC is reduced to low level. In this embodiment, too, the read operation is performed in advance of the write operation. The only difference from the configuration of FIG. 6 is the absence of the data line DLB. As described already, the information stored in the memory cell MC1 is read out as a signal of different polarity by the global data line GDL1, and amplified and detected by the sense amplifier based on the voltage (VDD/2) of the other global data line GDLB1 paired with the global data line GDL1. After that, as described above, the amplification voltage is replaced by the voltage of external write data and written in the memory cell MC1. At the same time, the original stored information voltage is rewritten in the other memory cells. The read operation and the refresh operation are also carried out in a similar manner.

Figure 15:
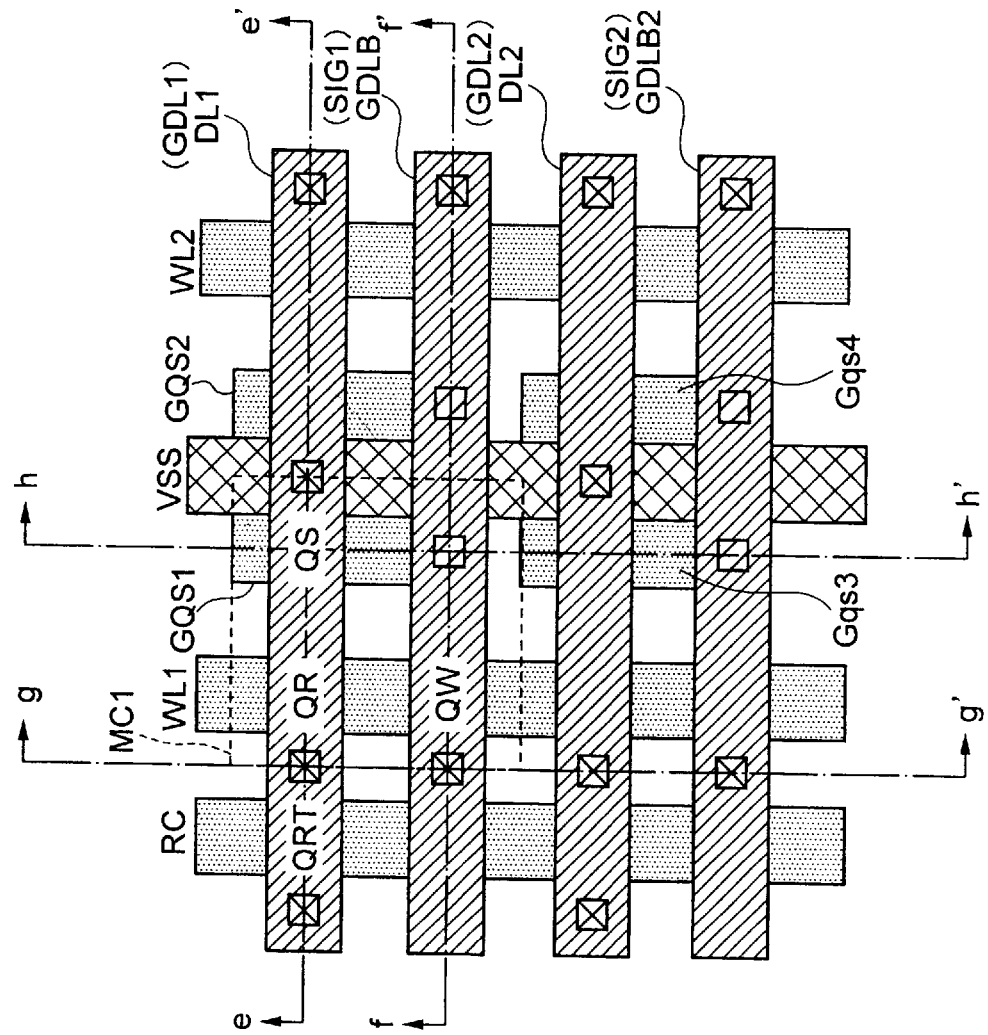
FIG. 15 is a diagram showing a layout of the connections around the memory cell according to the embodiment of the invention shown in FIG. 13.
Figure 16A:
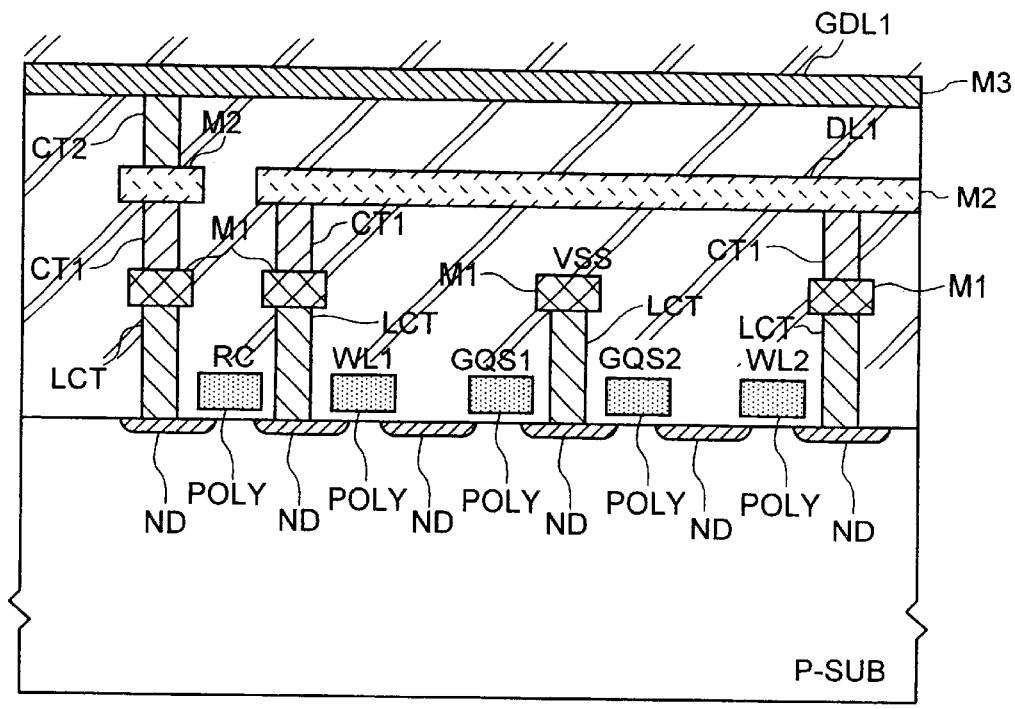
FIG. 16A is a sectional view taken in line e–e' in FIG. 15.
Figure 16B:
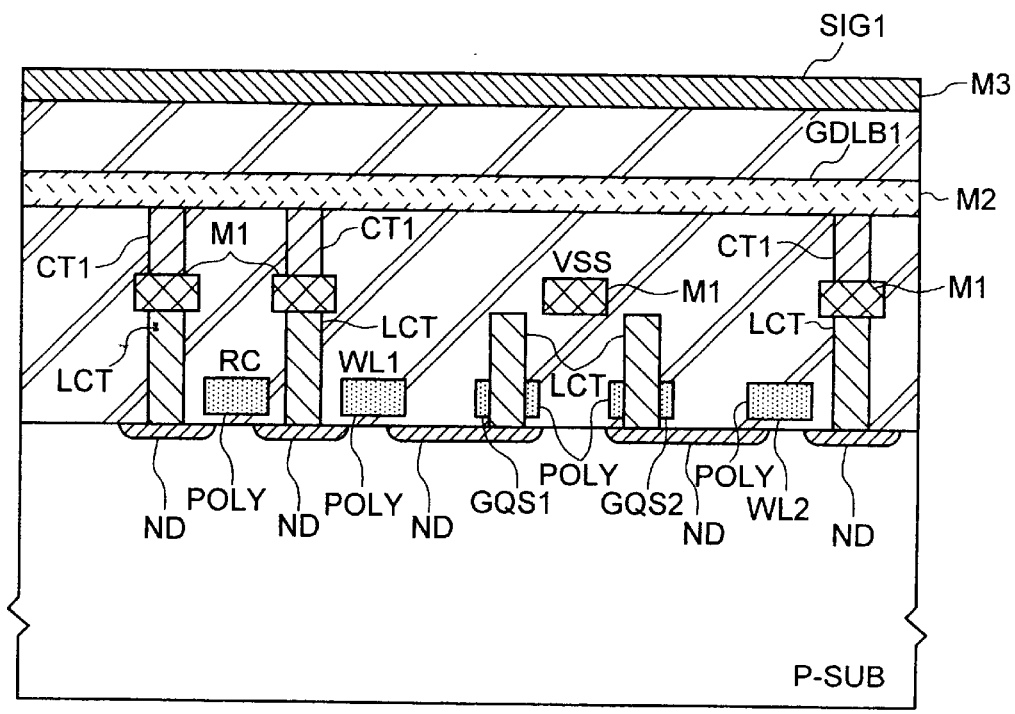
FIG. 16B is a sectional view taken in line f–f' in FIG. 14.
Figure 17A:
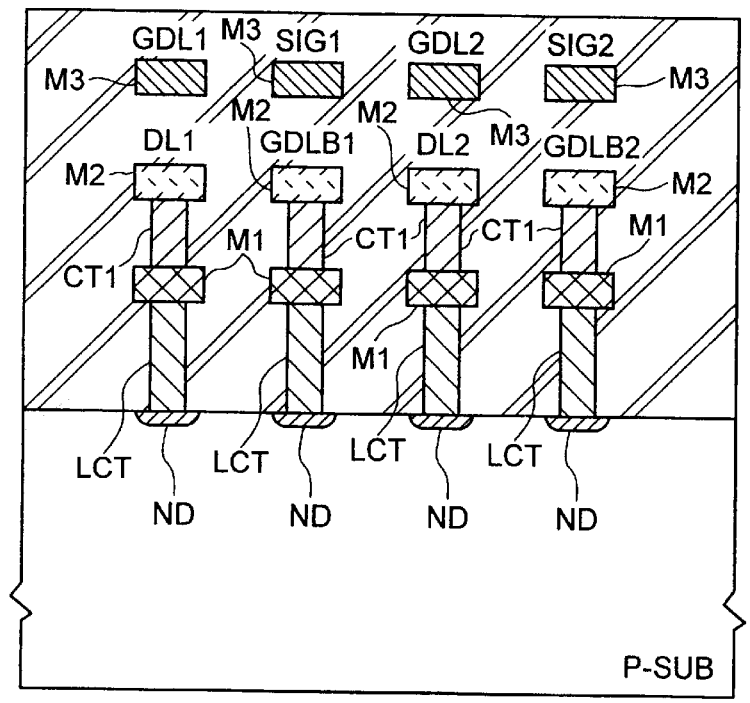
FIG. 17A is a sectional view taken in line g–g' in FIG. 15.
Figure 17B:
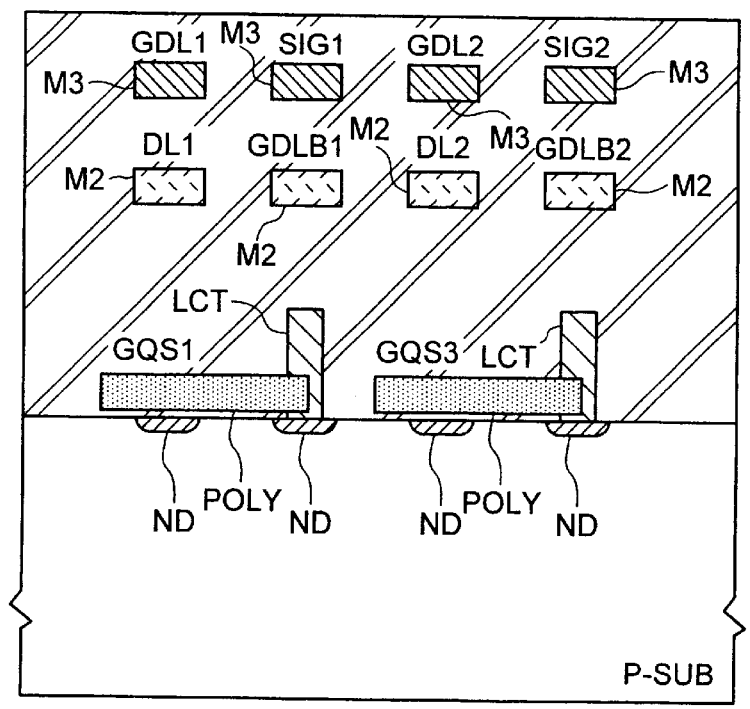
FIG. 17B is a sectional view taken in line h–h' in FIG. 14.

FIG. 15 shows a layout around the memory cell. The four memory cells and the transistor QRT and the transistor QWT shown in FIG. 13 are shown. The memory cell MC1 is such that a part of the word line WL1 fabricated of a polysilicon layer or the like forms the gates of the transistors QR and QW, and the polysilicon layer forms the gate of the transistor QS. The local data line DL and the global data line GDLB are wired with the metal of the same layer (M2), while the global data line GDL and the signal lines (SIG1, SIG2, etc.) such as the column select line are formed of the metal of another layer (M3). The contact LCT shown in FIG. 15 directly connects the diffusion layer and the gate. The power from the power supply VSS is applied to the source of the transistor QS, which is formed with a single metal layer shared by the adjacent memory cell to reduce the size. As a result, the two memory cells are arranged in the mirror symmetric relationship. The data lines DL and GDL are connected by the MOSFET QRT having a part of the wiring of polysilicon or the like as a gate. To clarify the relation between the layers, the sectional views taken in lines e–e' and f–f' of FIG. 15 are shown in FIGS. 16A and 16B. FIG. 16A is a sectional view taken in line e–e' passing through the read data line DL1 and the global data line GDL1. FIG. 16B is a sectional view taken in line f–f' passing through the global data line GDLB1 and the signal line. In FIG. 15, two contacts LCT are arranged. Further, the sectional views taken in lines g–g' and h–h' orthogonal to the sectional views taken in lines e–e' and f–f' are shown in FIGS. 17A and 17B. Two contacts LCT are shown in FIG. 17B.

Embodiment 5

Figure 18A:
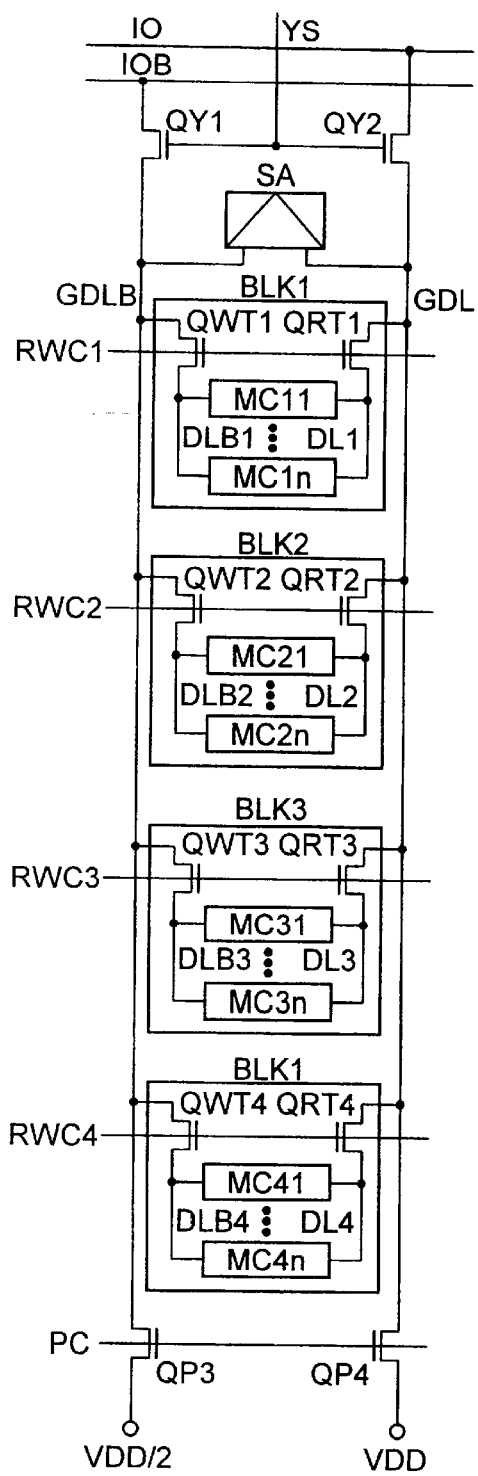
Figure 18B:
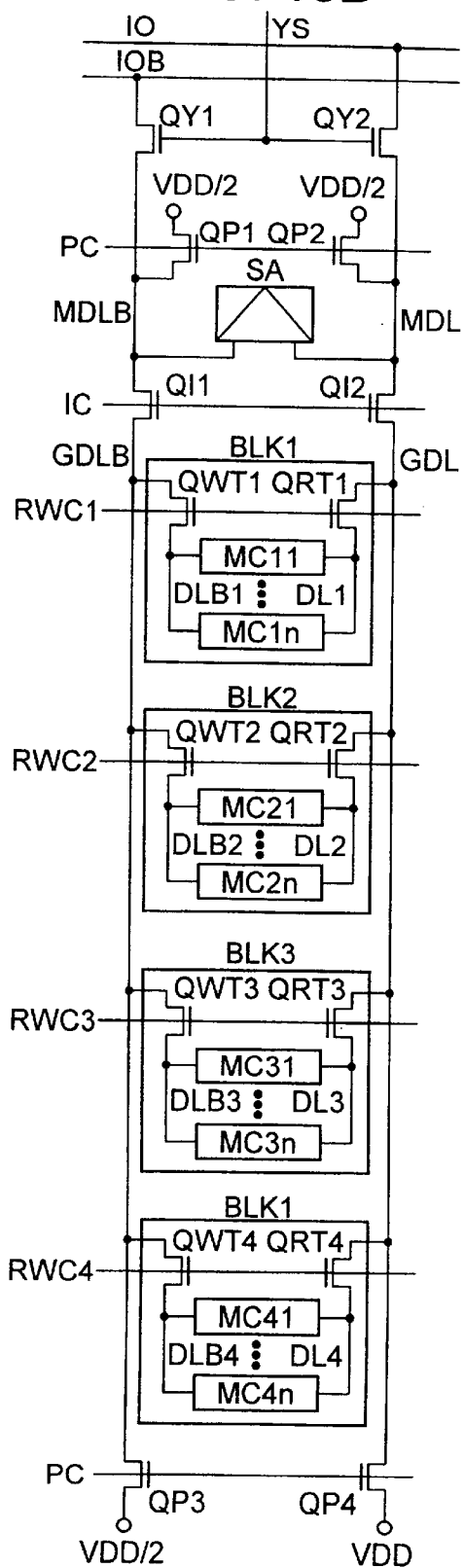

FIGS. 18A, 18B show an embodiment of the invention intended to reduce the number of the precharge power wirings in the array thereby to further save the space. FIG. 18A shows the case where the sense amplifier of FIG. 2B, for example, is used, and FIG. 18B shows the case where the sense amplifier of FIG. 2A, for example, is used. This embodiment has the feature that the precharge power wiring for the pair of the local data lines which has been required for each block BLK in FIG. 5 is eliminated, and the precharge power supply is shared by the pair of the global data lines. FIGS. 18A, 18B show the case having four blocks, but the present invention can be implemented with any number of blocks other than four. First, reference is had to FIG. 18A. In FIG. 18A, the global data line GDL and the local data lines DL (DL1 to DL4) are precharged to the source voltage VDD during the precharge period, while the global data line GDLB and the local data lines DLB (DLB1 to DLB4) are precharged to the half precharge level VDD/2 during the precharge period. For this to be accomplished, all the control signals RWC (RWC1 to RWC4) are required to be set to high level (turned on) during the precharge period. During the precharge period, the sense amplifier activation signal SPE is set to high level and the signal SNE is set to low level in order to eliminate the rash current. The rash current which otherwise might pose a problem during the precharge period is generated in the event that the precharge voltages of the data lines GDL and GDLB are not equal to VDD and VDD/2, respectively. In the case where the sense amplifier shown in FIG. 2A is used, for example, the transistor Q4 is turned half on during the precharge period and therefore the current undesirably flows from the global data line GDL to the common source line SAN.

Figure 19:
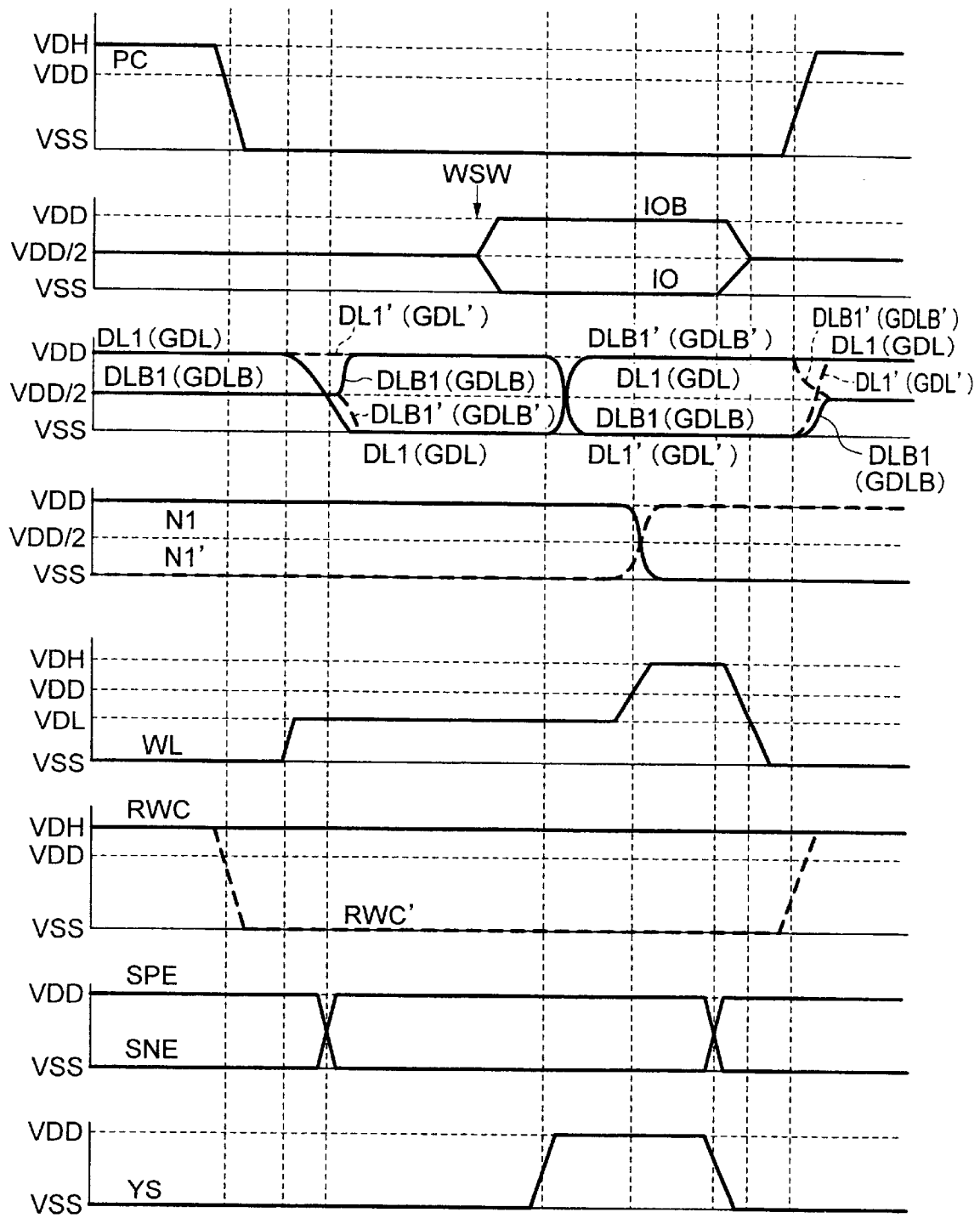
FIG. 19 shows operation waveforms for the write operation in FIG. 17A.

The write operation according to this embodiment shown in FIG. 18A will be explained with reference to FIG. 19. The read operation is performed in advance of the write operation according to this embodiment. The read operation will be explained taking the memory cell MC11 of the block BLK1 as an example. In FIG. 19, the word line connected to each memory cell is not shown. The data lines are precharged when the precharge signal (PC) is at high level. In the process, the pair of the global data lines GDL, GDLB are precharged to VDD and VDD/2, respectively. At the same time, the control signal RWC1 is set to high level and the pair of the local data lines is connected to the pair of the local data lines DL1, DLB1 in order to precharge the pair of the local data lines DL1, DLB1. As a result, the pair of the local data lines DL1, DLB1 are precharged to VDD and VDD/2, respectively. For starting the read operation, the precharge is required to be stopped by setting the precharge signal PC to low level. When the precharge signal PC is at low level, the potential of the word line is set to the read level VDL thereby to start the read operation from the memory cell of a selected row. In the process, the control signals RWC2 to RWC4 of the unselected blocks are desirably set to low level as designated by RWC' in FIG. 19. By doing so, the load capacitance on the pair of the global data lines can be reduced. This is by reason of the fact that the memory cell transistors of the unselected blocks are electrically disconnected with the pair of the global data lines, and therefore the load capacitance can be reduced by an amount equivalent to the parasitic capacitance due to the MOSFETs not connected. After waiting until the read potential for the local data line DL1 and the global data line GDL is reduced below VDD/2, the sense amplifier activation signal SPE is set to low level and the signal SNE to high level, so that the sense amplifier is activated and the read signal is amplified accurately to 0, 1.

In the first step of the read operation for the memory cell, the column select switches QY1 and QY2 are turned on so that the write signal voltage transmitted to the pair of the common data lines is transmitted to the pair of the global data lines. After that, the word line is set to the write level VDH so that the write signal is transmitted to the storage node N1 of the memory cell. In this way, the word line is set to the column unselected level of 0 V thereby to electrically isolate the storage node from the local data line. After that, the precharge state is restored in the same manner as explained with reference to FIG. 2.

Reference is made to FIG. 18B showing a modification of the embodiment explained with reference to FIG. 18A. This modification has a different configuration of the sense amplifier. The shown configuration includes a sense amplifier having an equal precharge level for the pair of the data lines connected to the sense amplifier. The pair of the global data lines GDL and GDLB shown in FIG. 18B have the precharge level of VDD and VDD/2, respectively, which are not equal to each other. In view of this, a pair of main data lines MGDL, MGDLB having the precharge level of VDD/2 and isolated by the isolating MOSFETs Qi1 and Qi2 are newly provided and connected to the sense amplifier to amplify the read signal.

Figure 20:
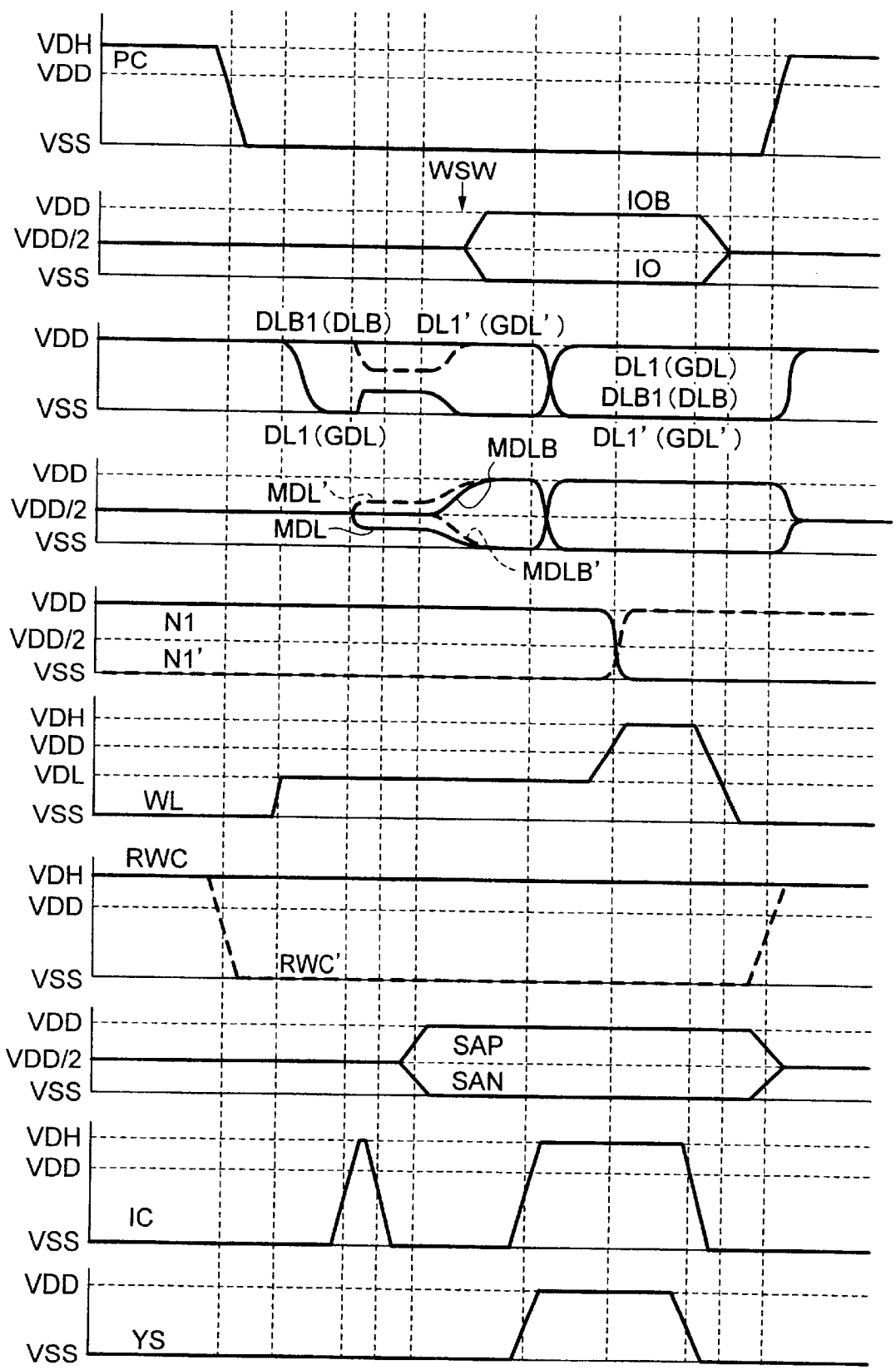
FIG. 20 shows operation waveforms for the write operation in FIG. 17B.

With reference to FIG. 20, the write operation according to the embodiment shown in FIG. 18B will be explained. In this case, too, the read operation is performed in advance of the write operation. The read operation will be explained taking the block BLK1 as an example. In FIG. 20, the word line connected to each memory cell is not shown. The data line is precharged when the precharge signal (PC) is at high level. In the process, the pair of the main data lines MGDL, MGDLB are precharged to VDD/2, and the pair of the global data lines GDL, GDLB to VDD and VDD/2, respectively. At the same time, in order to precharge the pair of the local data lines DL1, DLB1, the control signals RWC1 to RWC4 are set to high level and the pair of the local data lines are connected to the pair of the global data lines. As a result, the pair of the local data lines DL, DLB are precharged to VDD and VDD/2, respectively. For starting the read operation, it is necessary to stop the precharge operation, which is accomplished by setting the precharge signal PC to low level. When the precharge signal PC is at low level, the potential of the word line is set to the read level VDL thereby to start the read operation from the memory cell of a selected row. In the process, the control signals RWC2 to RWC4 for the unselected blocks are desirably at low level as designated by RWC' in FIG. 20. By doing so, the load capacitance on the pair of the global data lines can be reduced. Upon complete reading onto the local data line DL1 and the global data line GDL, the control signal IC is set to high level, and the read signal voltage transmitted to the global data line is transmitted to the main data line MGDL. As a result, the charge share corresponding to the parasitic capacitance of each data line causes the read signals (±vs) having different polarities corresponding to the information voltage of the storage node to appear on the main data line MGDL. Since the the data lines GDLB and MGDLB have the same potential level (precharge level), the Potential remains unchanged. As described with reference to FIG. 6, therefore, the read signal of VDD/2+vs or VDD/2−vs is transmitted to the main data line MGDL in accordance with the read signal from the memory cell. After the read signal is transmitted to the main data line MGDL, the control signal IC is set to low level thereby to isolate the pair of the main data lines MGDL, MGDLB and the pair of the global data lines GDL, GDLB from each other. By thus isolating the global data lines at the time of amplification, the parasitic capacitance of the main data lines MGDL, MGDLB is reduced and therefore high-speed amplification is made possible. After that, the read signal is accurately amplified to 0, 1 by the sense amplifier connected to the main data lines.

For the write operation into the memory cell, the first step is to turn on the column select switches QY1, QY2 so that the write signal voltage transmitted to the pair of the common data lines is transmitted to the pair of the main data lines MGDL, MGDLB, and the control signal IC is set to high level, which control signal IC is transmitted to the pair of the global data lines by turning on the switches QI1, QI2. After that, the write signal is transmitted to the storage node N1 of the memory cell by setting the word line to the write level VDH, and the word line is set to the unselected level of 0 V thereby to isolate the storage node from the local data lines. Then, the precharge state is restored in the same manner as described with reference to FIG. 6. Incidentally, the precharge MOSFET QP1 and the isolating MOSFET Qi1 have the same precharge voltage for the data lines MGDLB, GDLB, and therefore are not required basically. Nevertheless, the advantage of the provision of these MOSFETs is that the pair of the main data lines MGDL and MGDLB are kept in electrical balancing level and therefore a stable amplification operation can be realized.

Embodiment 6

Figure 21:
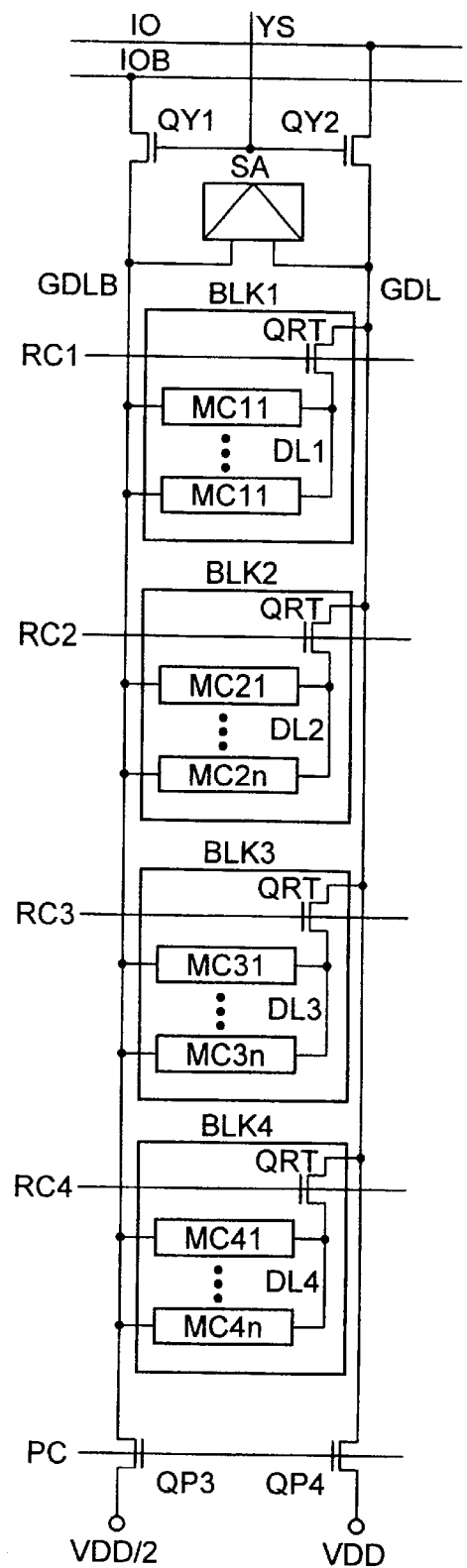
FIG. 21 shows a further embodiment of the invention.

FIG. 21 shows still another embodiment in which the precharge power supply is shared by the pair of the local data lines and the pair of the global data lines. This embodiment is equivalent to t he memory array configuration of the embodiment shown in FIG. 13 except that the precharge power siring is shared by the pair of the local data lines and the pair of the global data lines. This embodiment is also different from the embodiment of FIG. 13 in that the precharge level of the global data line GDL is set to VDD. By the way, the number of blocks is 4 in FIG. 21 to which the invention is not limited but can be implemented with other than four blocks.

The write operation and the read operation are substantially the same as those explained with reference to FIG. 14. Also, the operation for controlling the write and read operation to and from the global data lines is substantially the same as the corresponding operation explained with reference to FIG. 19. Specifically, the operation with the control signals RWC, RWC' are replaced with the operation with the read signals RC, RC' in FIG. 19, so that the control operation is performed in accordance with the operation waveforms not requiring the operation of the data line DLB1.

Embodiment 7

Figure 22:
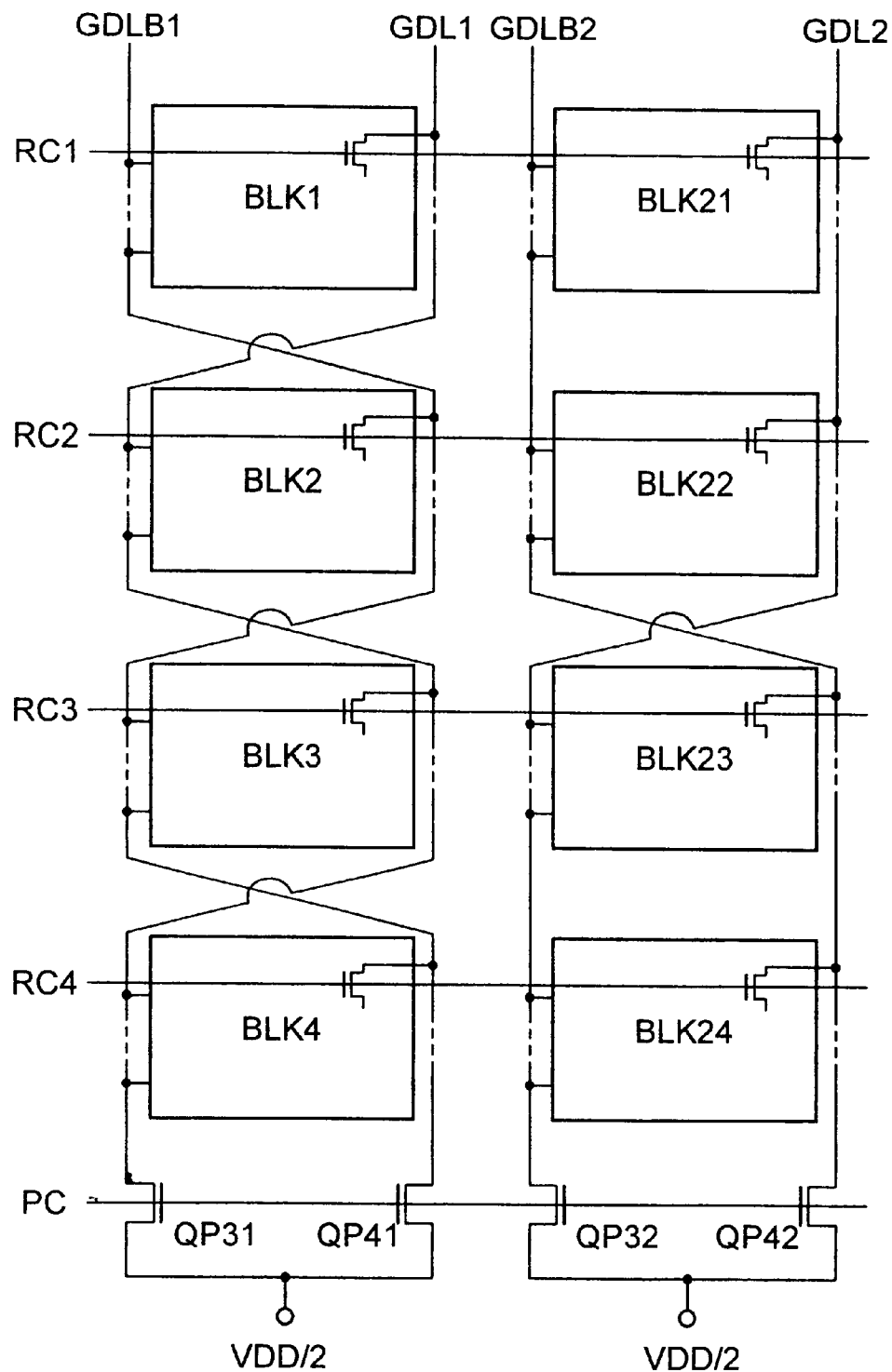
FIG. 22 shows a method of arranging the global data lines according to an embodiment of the invention.

In the memory array configuration shown in FIGS. 5, 10 and 13, the number of the MOSFETs connected to the pair of the global data lines GDL, GDLB is not uniform, and therefore the parasitic capacitance is different between the global data lines GDL and GDLB. As a result, an effective noise or a reduced operation speed is often caused from the viewpoint of the sense amplifier. FIG. 22 shows an embodiment in which the pair line configuration for reducing the ununiformity of the parasitic capacitance between the pair of the lines is employed in the configuration of FIG. 13.

According to this embodiment, the pair of the global data lines are twisted on the memory cell to obviate the ununiformity of the capacitance between the pair of the lines. Also, the noises generated in the global data lines GDL and GDLB can be successfully offset by changing the manner in which each adjacent pair of the global data lines are twisted, as shown in FIG. 22.

First, an explanation will be given of the equalization of the parasitic capacitance. For convenience' sake, adjacent pairs of the global data lines (GDL1, GDLB1 and GDL2, GDLB2) will be taken as an example. These global data line pairs each are assumed to be connected with four blocks each including n memory cells MC11 to MC1n. Also, assume that the block BLK11 is selected and the control signal RC is at high level. Under this condition, the data line GDL1 is connected with a total of 3n+2 transistors, i.e. (n+1) MOSFETs including the transistor QRT of the block BLK11 and the read MOSFETs connected thereto, n write MOSFETs for the BLK12, one read and transfer MOSFET for the block BLK13, and n write MCSFETs for the block BLK14. The global data line GDLB1, on the other hand, is connected with a total of 2n+1 MOSFETs including n write MOSFETs for the block BLK11, one read and transfer MOSFET for the block BLK13, n write MOSFETs for the block BLK13 and one read and transfer MOSFET for the block BLK14. In the case where the global data lines are not twisted, the number of the MQSFETs connected to the global data line GDL is n+4 in total including the transistor QRT of the block BLK11 and n read MOSFETs connected thereto, a read and transfer MOSFET for the block BLK12, a read and transfer MOSFET for the block BLK13 and a read and transfer MOSFET for the block BL14. The number of the MOSFETs connected to the global data line GDLB, on the other hand, is 4n in total including n write MOSFETs for the block BLK11, n write MOSFETs for the block BLK12, n write MOSFETs for the block BLK13 and n write MOSFETs for the block BLK14 to this way, the imbalance of the number of the MOSFETs connected to the global data line pair is remarkably improved. In similar fashion, the arrangement of the pair of the global data lines as indicated by the data lines GDL2, GDLB2 also equalizes the number of connections on the read and write sides of the block BLK and therefore clearly improves the imbalance of the number of the connected MOSFETs.

Now, the reduction in the noise appearing in the global data lines GDL and GDLB will be explained. At the time of write and read operations of the memory, the data lines GDL and GDLB change from the precharge level to VDD or VSS. This process is known to generate a noise in adjacent global data lines due to capacitive coupling. In the case where the data lines GDL and GDLB are arranged as shown in FIG. 22, the pair of the global data lines (GDL2, GDLB2) of equal length are arranged adjacently to, say, the data line GDL1, the same noise comes to appear on the data lines GDL2 and GDLB2. The same level of the noises generated in the data lines GDL2 and GDLB2 eliminates the likelihood of a malfunction at the time of amplification operation of the sense amplifier.

Incidentally, the invention is not limited to this example in which a pair of global data lines are connected with four blocks.

Embodiment 8

Figure 23:
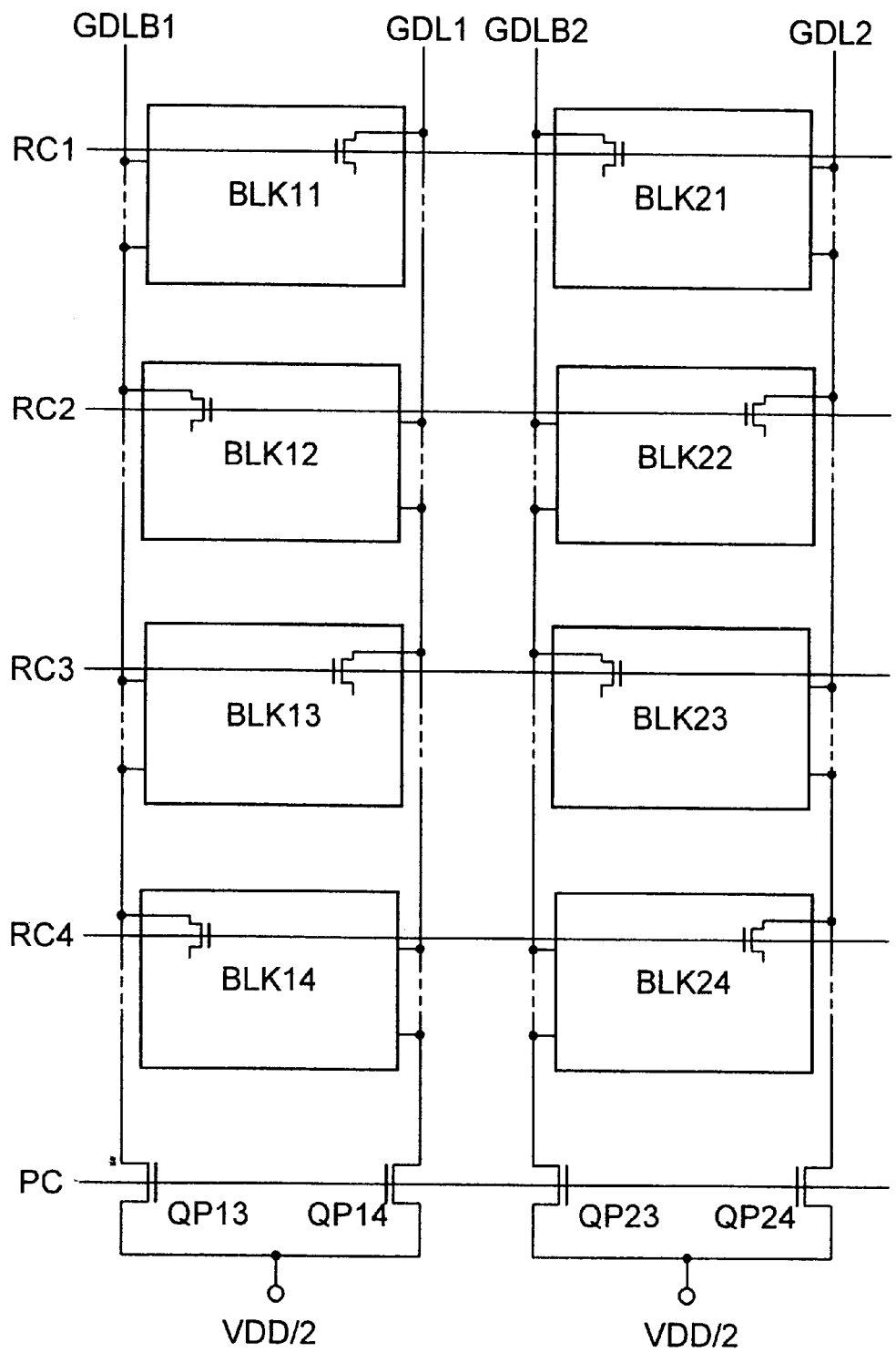
FIG. 23 is a method of connecting the blocks and the global data lines according to an embodiment of the invention.

FIG. 23 shows another embodiment in which the parasitic capacitance of the pair of the global data lines is maintained in equilibrium. In this embodiment, the read and transfer MOSFET is connected to the global data line GDL2 of one half of the blocks (BLK11 and BLK13, for example) connected to the global data line pair. For the remaining one half of the blocks (BLK12 and BLK14, for example), a write MOSFET is connected to the data line GDL1, and a read and transfer MOSFET is connected to the data line GDLB1. In the case where the block BLK11 is selected, therefore, (3n+2) MOSFETs are connected to the data line GDL1, and (2n+2) MOSFETs are connected to the GDLB1. This case uses a structure in which the pair of the global data lines are not twisted to obviate the imbalance of capacitance. The twisting of wirings generally uses two or more metal wiring layers. According to this invention, therefore, the number of the wiring layers used can be reduced. Thus, space can be saved by allotting the limited wiring layers to other signal lines and power lines. In the shown case, the blocks such as BLK11 and BLK12 connected to the adjacent global data line pairs are arranged in the mirror symmetric relationship with respect to the global data lines. Nevertheless, the arrangement in mirror symmetric relationship is not necessarily required, but the blocks can be arranged in any manner determined from the viewpoint of the layout ease.

Embodiment 9

Figure 24:
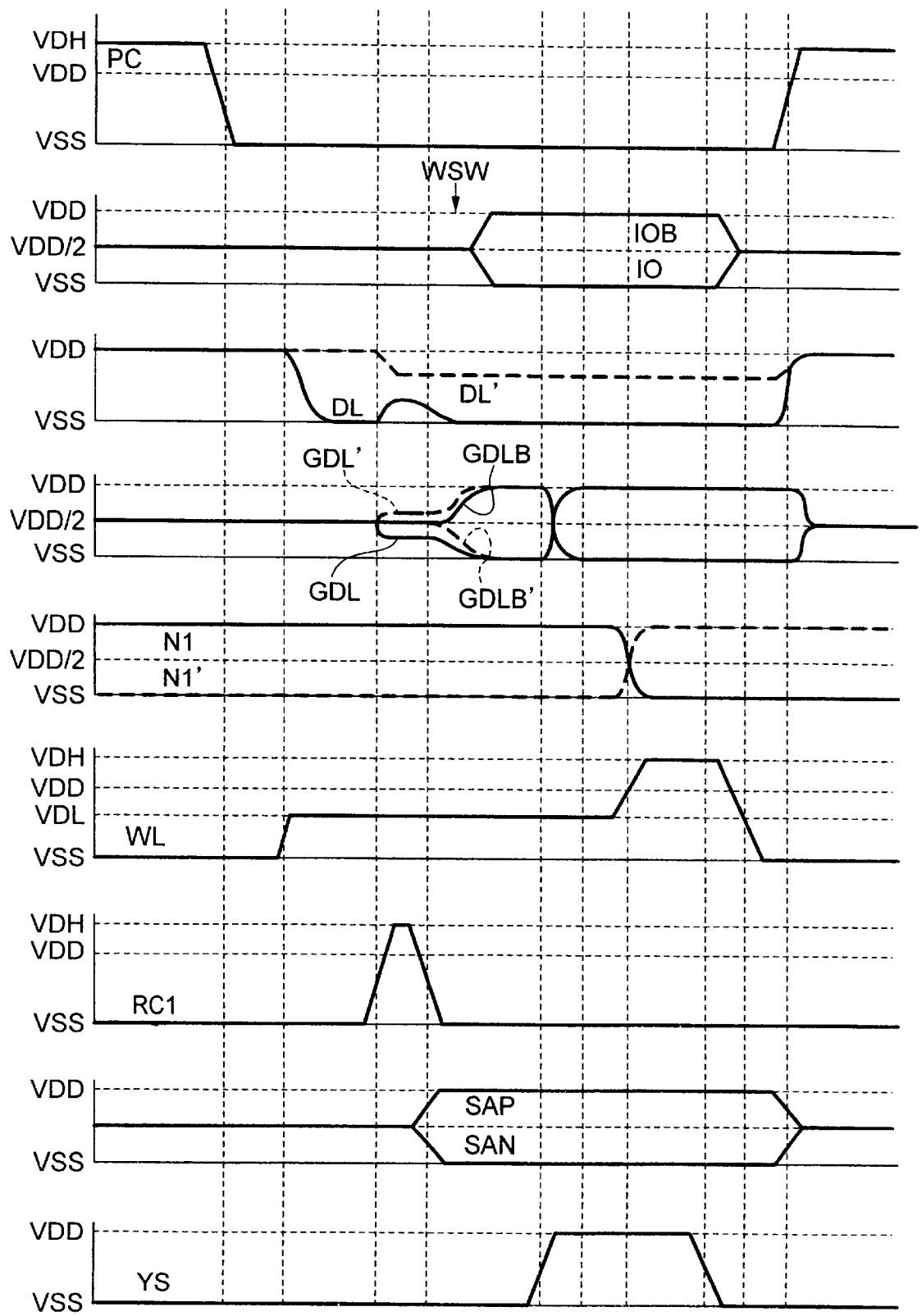
FIG. 24 is a diagram for establishing the electrical balance of the global data lines according to an embodiment of the invention.

FIG. 24 shows waveforms for explaining still another embodiment of the invention intended to equalize the parasitic capacitance generated in the data lines GDL and GDLB of the memory cell. The embodiment of FIG. 13 will be taken as an example. This embodiment relates to a method of controlling the control signal for transmitting the information stored in the memory cell to the global data lines. According to this embodiment, the read data is transferred to the global data line GDL by turning on the read and transfer MOSFET by the control signal RC1, after which the read and transfer MOSFET is turned off before amplification in the sense amplifier. Since the n transistors QR of the selected block are electrically isolated from the data line GDL, the capacitance involved fails to function as a load capacitance at the time of operation of the sense amplifier. Thus, the MOSFETs connected to the data lines GDL and GDLB number 2n+2, thereby further obviating the imbalance of parasitic capacitance.

The present invention eliminates the need of the dummy cell which has been essential to the conventional DRAM circuit using the gain cell, and therefore can reduce the required space and the fabrication cost. Also, the hierarchical data line structure makes high-speed operation possible.

What is claimed is:

1. A semiconductor device comprising:
   first and second wiring lines;
   a first memory block having a first switch, a plurality of first word lines, and a plurality of first memory cells; and
   a second memory block having a second switch, a plurality of second word lines, and a plurality of second memory cells;
   wherein each of said plurality of first memory cells has a first transistor, a second transistor, and a third transistor, gates of said first and second transistors are coupled to one of said plurality of first word lines, a gate of said third transistor is coupled to a drain/source path of said first transistor, and a drain of said third transistor is coupled to a drain/source path of said second transistor,
   wherein each of said plurality of second memory cells has a fourth transistor, a fifth transistor, and a sixth transistor, gates of said fourth and fifth transistors are coupled to one of said plurality of first word lines, a gate of said sixth transistor is coupled to a drain/source path of said fourth transistor, and a drain of said sixth transistor is coupled to a drain/source path of said fifth transistor, wherein said drain/source paths of said first transistors of said first memory cells are coupled to said first wiring line, wherein said drain/source paths of said fourth transistors of said second memory cells are coupled to said second wiring line, wherein said drain/source paths of said second transistors of said first memory cells are coupled to said second wiring line via said first switch, and wherein said drain/source paths of said fifth transistors of said second memory cells are coupled to said second wiring line via said second switch.

2. The semiconductor device according to claim 1, wherein said third and sixth transistors hold an information voltage at respective gates thereof and are turned on/off in accordance with said information voltage, wherein the information voltage is read out through said second and fifth transistors, and wherein the information voltage is written to said third and sixth transistors through said first and fourth transistors.

3. The semiconductor device according to claim 1, further comprising:

a precharge circuit coupled to said first and second wiring lines.

4. The semiconductor device according to claim 3, wherein said precharge circuit precharges said first and second wiring lines to VDD/2 level.

5. The semiconductor device according to claim 3, further comprising:

a third memory block having a third switch, a plurality of third word lines, and a plurality of third memory cells; and a fourth memory block having a fourth switch, a plurality of fourth word lines, and a plurality of fourth memory cells;

wherein each of said plurality of third memory cells has a seventh transistor, an eighth transistor, and a ninth transistor, gates of said seventh and eighth transistors are coupled to one of said plurality of third word lines, a gate of said ninth transistor is coupled to a drain/source path of said seventh transistor, and a drain of said ninth transistor is coupled to a drain/source path of said eighth transistor, wherein each of said plurality of fourth memory cells has a tenth transistor, an eleventh transistor, and a twelfth transistor, gates of said tenth and eleventh transistors are coupled to one of said plurality of fourth word lines, a gate of said twelfth transistor is coupled to a drain/source path of said tenth transistor, and a drain of said twelfth transistor is coupled to a drain/source path of said eleventh transistor, wherein said drain/source paths of said seventh transistors of said third memory cells are coupled to said first wiring line, wherein said drain/source paths of said tenth transistors of said fourth memory cells are coupled to said second wiring line, wherein said drain/source paths of said eighth transistors of said third memory cells are coupled to said second wiring line via said third switch, wherein said drain/source paths of said eleventh transistors of said fourth memory cells are coupled to said second wiring line via said fourth switch, wherein said second memory block is laid between said first and third memory blocks, and wherein said first and second memory blocks are adjacent to each other.

* * * * *